US012676614B2

(12) United States Patent
Kim et al.

(10) Patent No.: US 12,676,614 B2
(45) Date of Patent: Jul. 7, 2026

(54) BUFFER CIRCUIT HAVING ENHANCED SLEW RATE

(71) Applicant: MagnaChip Semiconductor, Ltd., Cheongju-si (KR)

(72) Inventors: Hyoungkyu Kim, Cheongju-si (KR); Sangho Lee, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 108 days.

(21) Appl. No.: 18/774,477

(22) Filed: Jul. 16, 2024

(65) Prior Publication Data

US 2025/0183896 A1 Jun. 5, 2025

(30) Foreign Application Priority Data

Dec. 5, 2023 (KR) ........................ 10-2023-0174685

(51) Int. Cl.
*H03K 19/0185* (2006.01)
*H03K 19/003* (2006.01)
(52) U.S. Cl.
CPC .............. *H03K 19/018528* (2013.01); *H03K 19/00315* (2013.01)

(58) Field of Classification Search
None
See application file for complete search history.

(56) References Cited

U.S. PATENT DOCUMENTS 9,543,912 B2 * 1/2017 Lee .......................... H03F 3/301
11,955,090 B2 4/2024 Lee

* cited by examiner

*Primary Examiner* — Kenneth B Wells
(74) *Attorney, Agent, or Firm* — NSIP Law

(57) ABSTRACT

A buffer circuit includes an input stage configured to provide a differential current to a load stage or receive the differential current from the load stage based on a difference between an input voltage and an output voltage, wherein the load stage is configured to apply gate voltages to first and second output transistors of an output stage, and wherein the output stage is configured to regulate the output voltage; a slew rate compensation circuit configured to provide a slew rate compensation current to the load stage or receive the slew rate compensation current from the load stage; an offset control signal output stage configured to output an offset control signal by being applied with first and second N-bit control signals; and an offset blocking circuit comprising a switch configured to turn off a current source of the slew rate compensation circuit by the offset control signal.

20 Claims, 8 Drawing Sheets

FIG.8

BUFFER CIRCUIT HAVING ENHANCED SLEW RATE

CROSS REFERENCE TO RELATED APPLICATION

The application claims the benefit under 35 USC § 119 (a) of Korean Patent Application No. 10-2023-0174685, filed Dec. 5, 2023, in the Korean Intellectual Property Office, the entire disclosure of which is incorporated herein by reference for all purposes.

BACKGROUND

1. Field

The following description relates to a buffer circuit having an enhanced slew rate.

2. Description of the Background

Display driver integrated circuits (DDIC) are widely used in devices such as portable electronic devices (e.g., smartphones, tablet personal computers) and vehicle displays (digital instrument clusters, navigation, etc.). DDIC is a source driving circuit for driving panels such as LCD and OLED devices and includes an output buffer circuit that outputs data. For these DDICs, there is an increasing demand for performance improvement in relation to high resolution, display quality, low power consumption, etc.

The buffer amplifier of the DDIC's source driving circuit exists independently for each R/G/B representing a pixel, or exists only for each R/G/B pixel for higher resolution, but may be time divided to drive each R/G/B pixel. During the time-division driving, the time given to each source driving circuit for data output is reduced, and the slew-rate of the buffer amplifier must be improved accordingly. Additionally, to satisfy high resolution, many source driving circuits and buffer amplifiers may be desired, which greatly affects the size and power consumption of the entire DDIC.

Therefore, there is a need for a buffer amplifier circuit that improves the slew rate, alleviates size constraints, and can be implemented at low power.

Meanwhile, when a slew rate compensation circuit that supplies a slew rate compensation current to improve the slew rate is additionally configured in the buffer circuit, there is a problem that an overshoot or undershoot occurs in a transient response state for improving the slew rate. Even in a normal state, problems affecting the DC offset of the output voltage may occur due to noise, such as parasitic current provided from the compensation circuit.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a buffer circuit generating an output voltage based on an input voltage includes an input stage, a load stage, and an output stage, wherein the input stage is configured to provide a differential current to the load stage or receive a differential current from the load stage based on a difference between the input voltage and the output voltage, wherein the load stage is configured to apply gate voltages to first and second output transistors of the output stage based on the differential current, and wherein the output stage is configured to regulate the output voltage based on the gate voltages applied to the first and the second output transistors; a slew rate compensation circuit configured to provide a slew rate compensation current to the load stage or receive a slew rate compensation current from the load stage based on the difference between the input voltage and the output voltage; an offset control signal output stage configured to output an offset control signal by being applied with first and second N-bit control signals which are logic signals; and an offset blocking circuit comprising a switch configured to turn off a current source of the slew rate compensation circuit by the offset control signal.

The slew rate compensation circuit may include a first slew rate compensation circuit comprising a current source configured to provide a first slew rate compensation current to the load stage when a difference between a rising transition of the input voltage and a rising transition of the output voltage following the input voltage is equal to or more than a first reference voltage; and a second slew rate compensation circuit comprising a current source configured to receive the second slew rate compensation current from the load stage when a difference between a falling transition of the input voltage and a falling transition of the output voltage following the input voltage is equal to or more than a second reference voltage.

The first slew rate compensation circuit may include a first comparator comprising an NMOS transistor having a gate configured to receive the input voltage, a drain connected to a first node, and a source configured to receive the output voltage; a first current source configured to generate a first slew rate compensation circuit operation current flowing based on a difference between a power supply voltage and a voltage of a first node when the NMOS transistor of the first comparator performs a turn-on operation; a first slew rate transistor configured to receive the first slew rate compensation circuit operation current through a gate terminal connected to the first node and perform a turn-on operation based on the first slew rate compensation circuit operation current; and a second current source configured to generate the first slew rate compensation current based on the power supply voltage and provide the first slew rate compensation current to the load stage by the turn-on operation of the first slew rate transistor.

The second slew rate compensation circuit may include a second comparator comprising a PMOS transistor having a gate configured to receive the input voltage, a drain connected to a second node, and a source configured to receive the output voltage; a third current source configured to generate a second slew rate compensation circuit operation current flowing based on a difference between a ground voltage and a voltage of the second node when the PMOS transistor of the second comparator performs a turn-on operation; a second slew rate transistor configured to receive the second slew rate compensation circuit operation current through a gate terminal connected to the second node and perform a turn-on operation based on the second slew rate compensation circuit operation current; and a fourth current source configured to generate the second slew rate compensation current based on the ground voltage and receive the second slew rate compensation current from the load stage by the turn-on operation of the second slew rate transistor.

The switch of the offset blocking circuit may include a first switch having a gate configured to receive a first offset control signal, a source connected to a power supply voltage, and a drain connected to the first node of the first slew rate compensation circuit; and a second switch having a gate configured to receive a second offset control signal, a drain connected to the second node of the second slew rate compensation circuit, and a source connected to a ground voltage.

The offset control signal output stage may turn on the first switch by generating a first offset control signal of a low level after a first predetermined time elapses by the first N-bit control signal, and turn off the first switch by generating a first offset control signal of a high level after a second predetermined time elapses by the second N-bit control signal.

The offset control signal output stage may turn on the second switch by generating a second offset control signal of a high level after a first predetermined time elapses by the first N-bit control signal, and turn off the second switch by generating a second offset control signal of a low level after a second predetermined time elapses by the second N-bit control signal.

The offset blocking circuit may turn off a current source of the first slew rate compensation circuit by generating a level of a voltage same as a level of a power supply voltage to the first node of the first slew rate compensation circuit, and turn off a current source of the second slew rate compensation circuit by generating a level of a voltage same as a level of a ground voltage to the second node of the second slew rate compensation circuit.

The load stage may include a first differential mirror circuit having a current mirror structure and a cascode structure, and configured to mirror a differential current generated by the difference between the input voltage and the output voltage and the first slew rate compensation current; a second differential mirror circuit having a current mirror structure and a cascode structure, and configured to mirror the differential current and the second slew rate compensation current; and a third bias circuit and a fourth bias circuit connected between the first differential mirror circuit and the second differential mirror circuit, and configured to control a static state operation and an amplification operation of the first differential mirror circuit and the second differential mirror circuit.

The first differential mirror circuit may include first and second load stage PMOS transistors configured to perform a current mirroring operation, and third and fourth load stage PMOS transistors connected in series with the first and second load stage PMOS transistors, respectively, to form a cascode structure. The first load stage PMOS transistor may have a gate in common with the second load stage PMOS transistor connected to the third bias circuit, a drain connected to a third node, and a source connected to a power supply voltage. The second load stage PMOS transistor may have a gate in common with the first load stage PMOS transistor connected to the third bias circuit, a drain connected to a seventh node, and a source connected to the power supply voltage. The third load stage PMOS transistor may have a gate connected between the third bias circuit and the first load stage PMOS transistor and configured to receive a second bias voltage, a drain connected to the third bias circuit and a fifth node, and a source connected the third node. The fourth load stage PMOS transistor may have a gate connected between the fourth bias circuit and the second load stage PMOS transistor and configured to receive the second bias voltage, a drain connected to the fourth bias circuit, and a source connected to the seventh node.

The first differential mirror circuit may be configured to receive the first slew rate compensation current through the third node from the slew rate compensation circuit.

The second differential mirror circuit may include first and second load stage NMOS transistors configured to perform a current mirroring operation, and third and fourth load stage NMOS transistors connected in series with the first and second load stage NMOS transistors, respectively, to form a cascode structure. The first load stage NMOS transistor may have a gate in common with the second load stage NMOS transistor connected to the third bias circuit, a drain connected to a fourth node, and a source connected to a ground voltage. The second load stage NMOS transistor may have as a gate in common with the first load stage NMOS transistor connected to the third bias circuit, a drain connected to an eighth node, and a source connected to the ground voltage. The third load stage NMOS transistor may have a gate connected between the third bias circuit and the first load stage NMOS transistor and configured to receive a fifth bias voltage, a drain connected to the third bias circuit, and a source connected to the fourth node. The fourth load stage NMOS transistor may have a gate connected between the fourth bias circuit and the second load stage NMOS transistor and configured to receive the fifth bias voltage, a drain connected to the fourth bias circuit, and a source connected to the eighth node.

The second differential mirror circuit may be configured to provide the second slew rate compensation current from the fourth node to the slew rate compensation circuit.

In another general aspect, a buffer circuit generating an output voltage based on an input voltage includes an input stage, a load stage, and an output stage, wherein the input stage is configured to provide a differential current to the load stage based on a difference between the input voltage and the output voltage or receive a differential current from the load stage, wherein the load stage is configured to apply gate voltages to first and second output transistors of the output stage based on the differential current, and wherein the output stage is configured to regulate the output voltage based on the gate voltages applied to the first and the second output transistors; a slew rate compensation circuit configured to provide to a first slew rate compensation current to the load stage when a difference between a rising transition in an N-th H section of a voltage level of an input voltage and a voltage level of an output voltage is equal to or more than a first reference voltage, and receive a second slew rate compensation current from the load stage when a difference between a falling transition in an N+1th H section of a voltage level of an input voltage and a voltage level of an output voltage is equal to or more than a second reference voltage; an offset control signal output stage configured to receive first and second N-bit control signals which are logic signals to output an offset control signal; and an offset blocking circuit comprising first and second switches configured to turn off a current source of the slew rate compensation circuit by the offset control signal.

The offset control signal output stage may turn on the first switch by generating a first offset control signal of a low level after a first predetermined time elapses since a time point when the N-th H section starts by the first N-bit control signal, and turn off the first switch by generating a first offset control signal of a high level after a second predetermined time elapses since the time point when the N-th H section starts by the second N-bit control signal.

The offset control signal output stage may turn on the second switch by generating a second offset control signal of a high level after a first predetermined time elapses since a time point when the N+1th H section starts by the first N-bit control signal, and turn off the second switch by generating a second offset control signal of a low level after a second predetermined time elapses since the time point when the N+1th H section starts by the second N-bit control signal.

In another general aspect, a method for controlling a buffer circuit includes comparing an input voltage to an output voltage of the buffer circuit; providing or receiving a slew rate compensation current to or from a load stage when a difference between the input voltage and the output voltage is equal to or more than a reference voltage; turning off transistors of the load stage based on the slew rate compensation current; increasing or decreasing a gate voltage of an output transistor of an output stage connected to the load stage; increasing a slew rate in a rising transition or a falling transition of the output voltage based on increase or decrease of the gate voltage of the output transistor; receiving first and second N-bit control signals which are logic signals at an offset control signal output stage and outputting first and second offset control signals; and controlling first and second switches of an offset blocking circuit configured to turn off a current source of a slew rate compensation circuit according to the first and second offset control signals.

The method may further include providing a first slew rate compensation current from the slew rate compensation circuit to the load stage when a difference between a rising transition in an N-th H section of the input voltage and the output voltage following the input voltage is equal to or more than a first reference voltage; and receiving, at the slew rate compensation circuit, a second slew rate compensation current from the load stage when a difference between a falling transition in an N+1th H section of the input voltage and the output voltage following the input voltage is equal to or more than a second reference voltage.

The method may further include turning on a first switch by generating a first offset control signal of a low level after a first predetermined time elapses since a time point when the N-th H section starts by the first N-bit control signal; blocking providing the first slew rate compensation current from the slew rate compensation circuit to the load stage; and turning off the first switch by generating a first offset control signal of a high level after a second predetermined time elapses since the time point when the N-th H section starts by a second N-bit control signal.

The method may further include turning on a second switch by generating a second offset control signal of a high level after a first predetermined time elapses since a time point when the N+1th H section starts by a first N-bit control signal; blocking providing the second slew rate compensation current from the load stage to the slew rate compensation circuit; and turning off the second switch by generating a second offset control signal of a low level after a second predetermined time elapses since the time point when the N+1th H section starts by a second N-bit control signal.

Other features and aspects will be apparent from the following detailed description, the drawings, and the claims.

BRIEF DESCRIPTION OF THE DRAWINGS

FIG. 8 is a view illustrating operation waveforms of an offset blocking circuit and an offset control signal output stage according to still another embodiment of the present disclosure.

Figure 1:
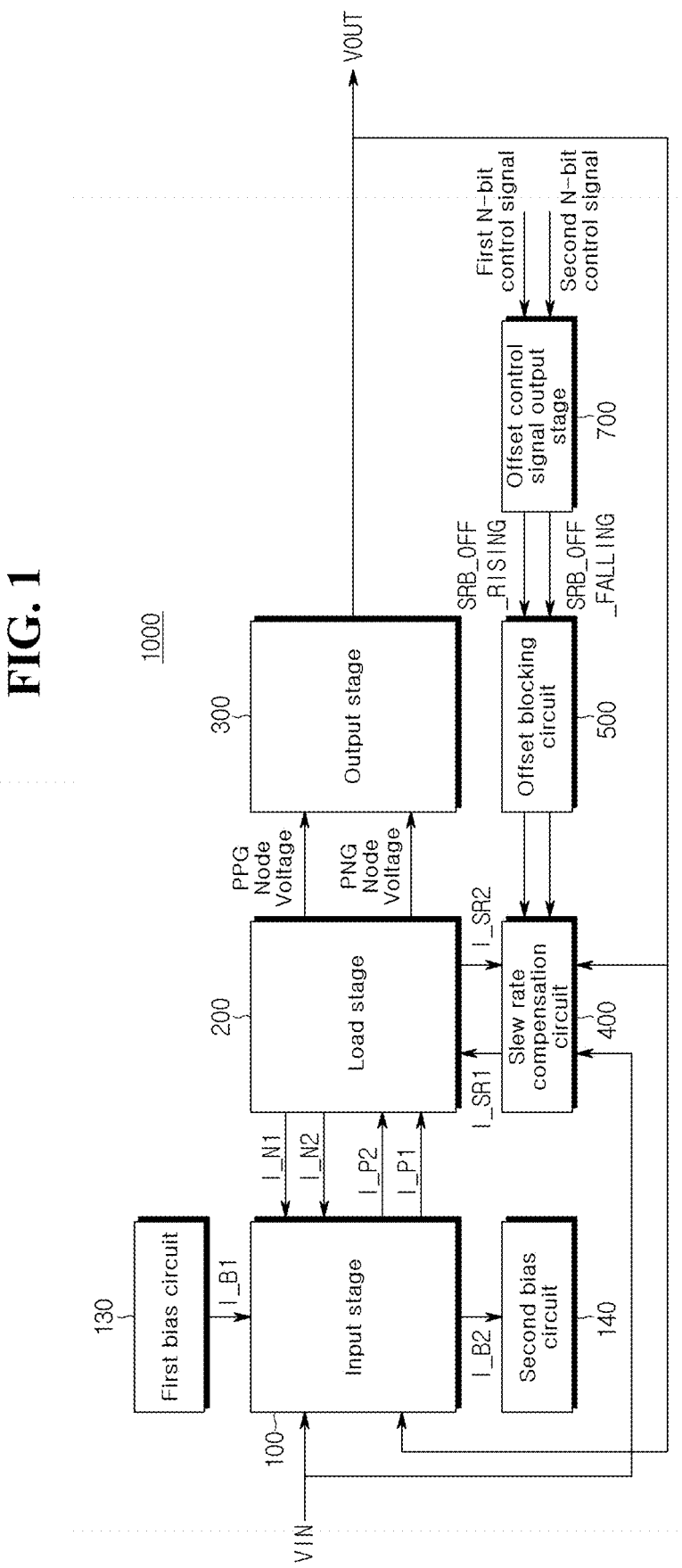
FIG. 1 is a block diagram illustrating a buffer circuit according to an embodiment of the present disclosure.

Throughout the drawings and the detailed description, unless otherwise described or provided, the same drawing reference numerals may be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences within and/or of operations described herein are merely examples, and are not limited to those set forth herein, but may be changed as will be apparent after an understanding of the disclosure of this application, except for sequences within and/or of operations necessarily occurring in a certain order. As another example, the sequences of and/or within operations may be performed in parallel, except for at least a portion of sequences of and/or within operations necessarily occurring in an order, e.g., a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. The use of the term "may" herein with respect to an example or embodiment, e.g., as to what an example or embodiment may include or implement, means that at least one example or embodiment exists where such a feature is included or implemented, while all examples are not limited thereto.

Throughout the specification, when a component or element is described as being "on", "connected to," "coupled to," or "joined to" another component, element, or layer it may be directly (e.g., in contact with the other component or element) "on", "connected to," "coupled to," or "joined to" the other component, element, or layer or there may reasonably be one or more other components, elements, layers intervening therebetween. When a component or element is described as being "directly on", "directly connected to," "directly coupled to," or "directly joined" to another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof, or the alternate presence of an alternative stated features, numbers, operations, members, elements, and/or combinations thereof. Additionally, while one embodiment may set forth such terms "comprise" or "comprises," "include" or "includes," and "have" or "has" specify the presence of stated features, numbers, operations, members, elements, and/or combinations thereof, other embodiments may exist where one or more of the stated features, numbers, operations, members, elements, and/or combinations thereof are not present.

Due to manufacturing techniques and/or tolerances, variations of the shapes shown in the drawings may occur. Thus, the examples described herein are not limited to the specific shapes shown in the drawings, but include changes in shape that occur during manufacturing.

Unless otherwise defined, all terms, including technical and scientific terms, used herein have the same meaning as commonly understood by one of ordinary skill in the art to which this disclosure pertains specifically in the context on an understanding of the disclosure of the present application. Terms, such as those defined in commonly used dictionaries, are to be interpreted as having a meaning that is consistent with their meaning in the context of the relevant art and specifically in the context of the disclosure of the present application, and are not to be interpreted in an idealized or overly formal sense unless expressly so defined herein.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Figure 2:
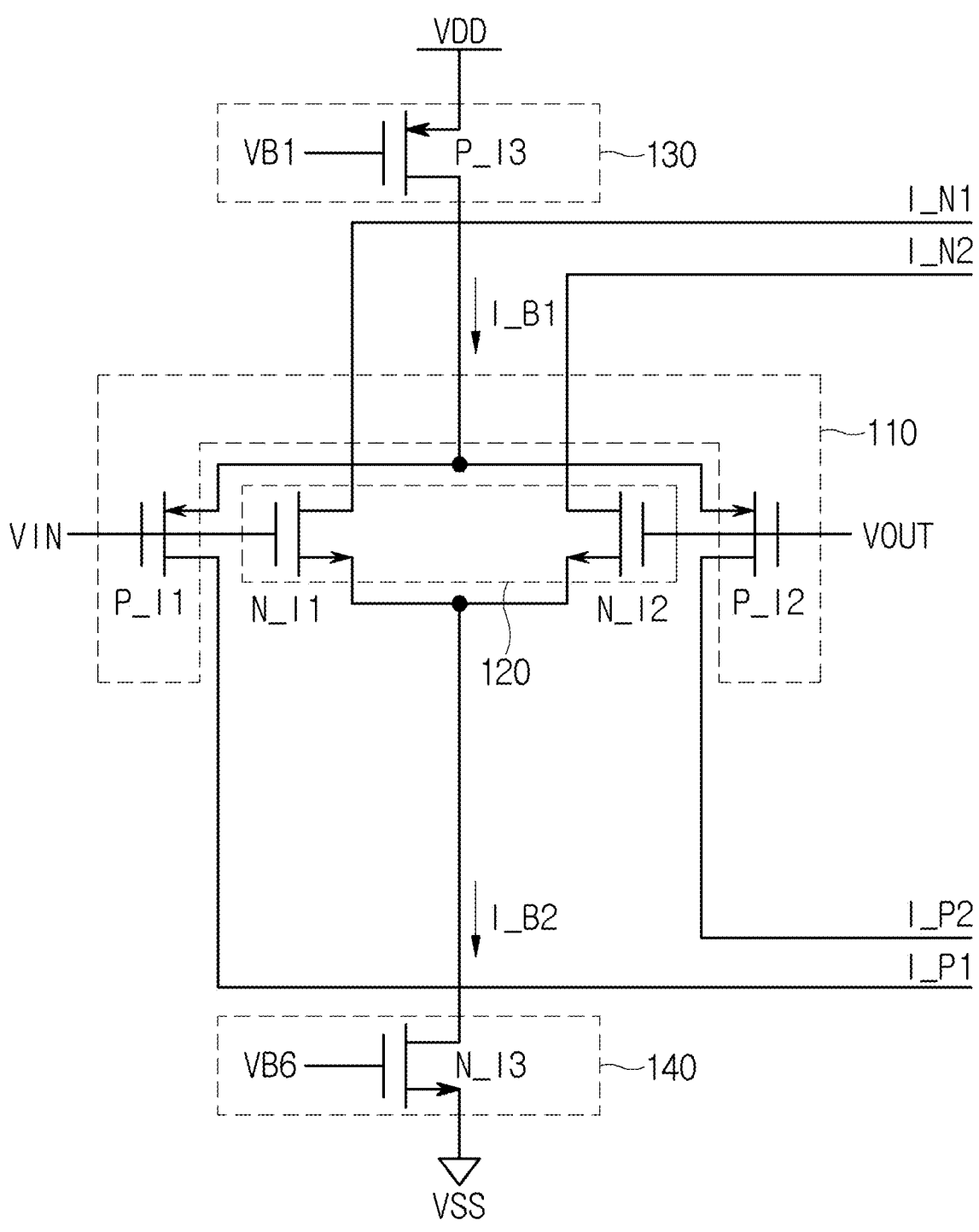
FIG. 2 is a diagram illustrating an input stage and a bias circuit according to an embodiment of the present disclosure.
Figure 3:
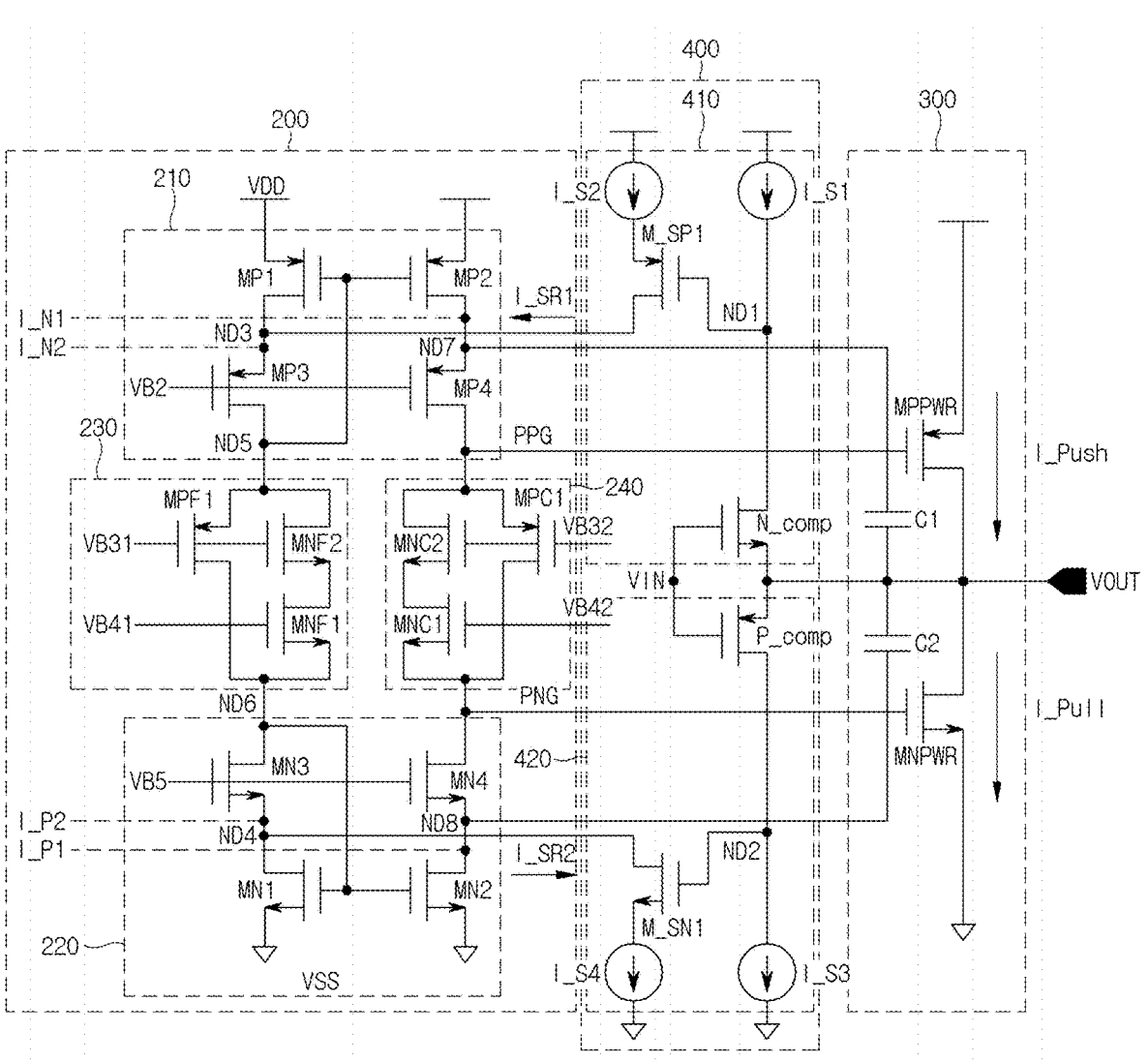
FIG. 3 is a circuit diagram illustrating a load stage, an output stage, and a slew rate compensation circuit according to an embodiment of the present disclosure.
Figure 4:
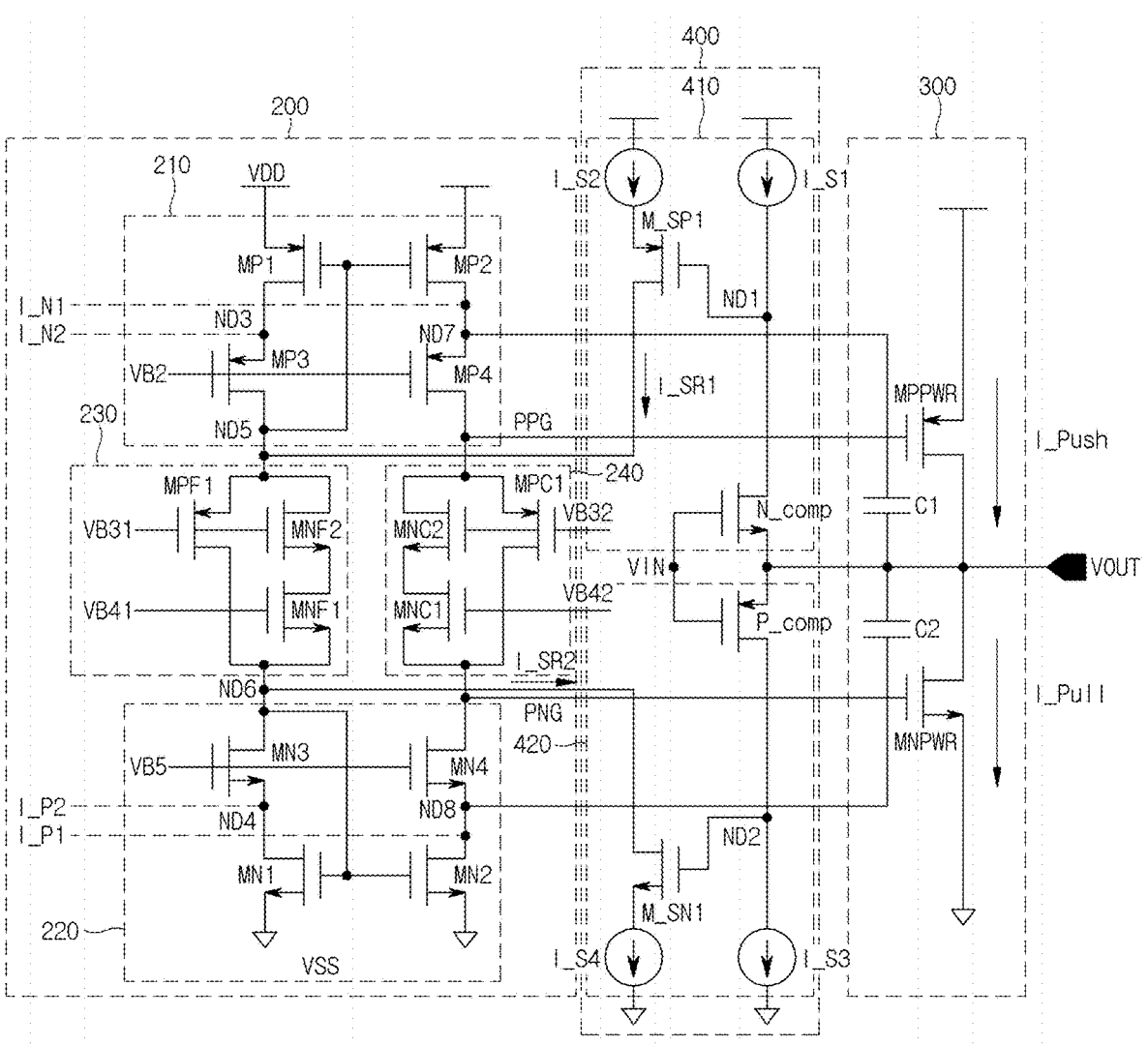
FIG. 4 is a circuit diagram illustrating a load stage, an output stage, and a slew rate compensation circuit according to another embodiment of the present disclosure.
Figure 5:
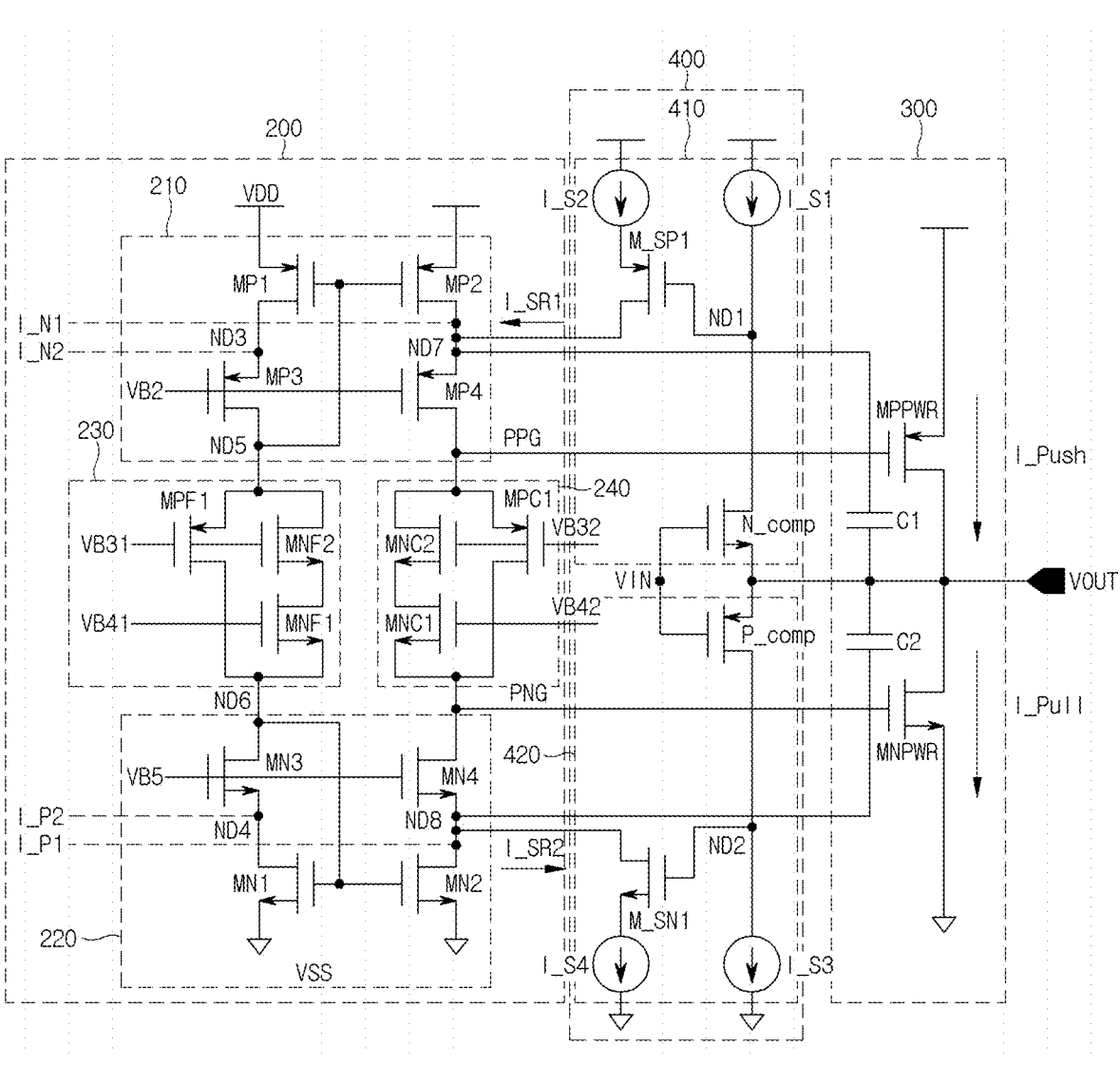
FIG. 5 is a circuit diagram illustrating a load stage, an output stage, and a slew rate compensation circuit according to still another embodiment of the present disclosure.
Figure 6:
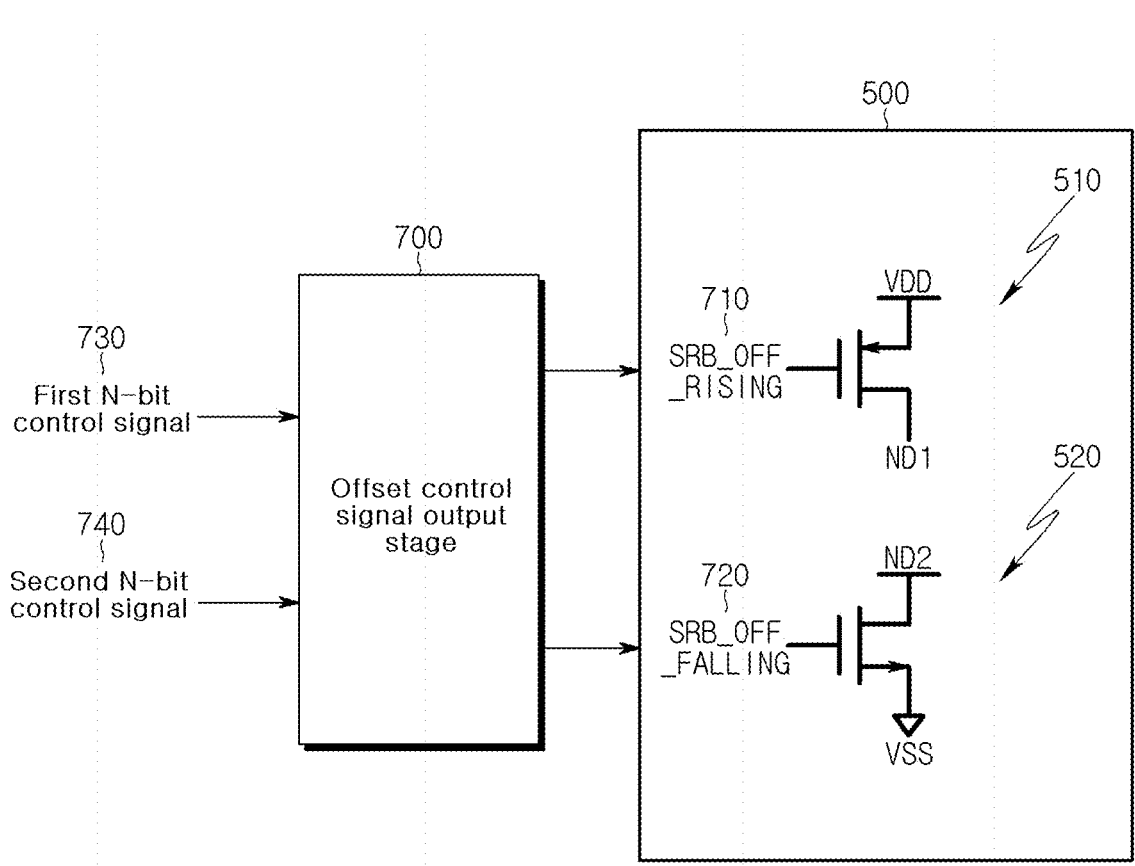
FIG. 6 is a circuit diagram illustrating an offset blocking circuit and an offset control signal output stage according to an embodiment of the present disclosure.

FIG. 1 is a block diagram illustrating a buffer circuit according to an embodiment of the present disclosure. In the embodiments below, a detailed structure of components illustrated in FIG. 1 will be described with reference to FIGS. 2 to 6. FIG. 2 is a diagram illustrating an input stage and a bias circuit according to an embodiment of the present disclosure. FIG. 3 is a circuit diagram illustrating a load stage, an output stage, and a slew rate compensation circuit according to an embodiment of the present disclosure. FIG. 4 is a circuit diagram illustrating a load stage, an output stage, and a slew rate compensation circuit according to another embodiment of the present disclosure. FIG. 5 is a circuit diagram illustrating a load stage, an output stage, and a slew rate compensation circuit according to still another embodiment of the present disclosure. FIG. 6 is a circuit diagram illustrating an offset blocking circuit and an offset control signal output stage according to an embodiment of the present disclosure.

Referring to FIG. 1, a buffer circuit 1000, according to an embodiment of the present disclosure, may include an input stage 100, a load stage 200, and an output stage 300, a slew rate compensation circuit 400, an offset blocking circuit 500, and an offset control signal output stage 700. The buffer circuit 1000 amplifies an input voltage VIN to output an output voltage VOUT. When the input voltage VIN increases or decreases, the buffer circuit 1000 may follow the increase or decrease and output the output voltage VOUT to increase or decrease. The buffer circuit 1000 may regulate the output voltage VOUT such that the input voltage VIN and the output voltage VOUT can be compared by performing feedback of the output voltage VOUT and the output voltage VOUT can follow the input voltage VIN. The buffer circuit 1000 may improve the slew rate such that the output voltage VOUT can rapidly follow the input voltage VIN with respect to a rising transition of the input voltage VIN. In addition, the buffer circuit 1000 may improve the slew rate such that the output voltage VOUT can rapidly follow the input voltage VIN with respect to a falling transition of the input voltage VIN.

The input stage 100 may provide first and second differential currents I_P1 and I_P2 to the load stage 200 based on a difference between the input voltage VIN and the output voltage VOUT output by the output stage 300 and fed back. In addition, the input stage 100 may receive third and fourth differential currents I_N1 and I_N2 from the load stage 200 based on a difference between the input voltage VIN and the output voltage VOUT output by the output stage 300 and fed back. Here, a sum of the first and the second differential currents I_P1 and I_P2 and a sum of the third and the fourth differential currents I_N1 and I_N2 may be the same. For example, when the input voltage VIN gets to a rising transition and becomes greater than the output voltage VOUT, the second differential current I_P2 and the third differential current I_N1 increase and the first differential current I_P1 and the fourth differential current I_N2 decrease, thereby the sum of the first and the second differential currents I_P1 and I_P2 and the sum of the third and the fourth differential currents I_N1 and I_N2 may be the same.

In more detail, according to an embodiment, when the input voltage VIN and the output voltage VOUT are both at a low level, the internal PMOS transistors of the input stage 100 configured to receive the input voltage VIN and the output voltage VOUT may be turned on and the input stage 100 may provide the first and the second differential currents I_P1 and I_P2 to the load stage 200. On the other hand, the internal NMOS transistors of the input stage 100 configured to receive the input voltage VIN and the output voltage VOUT may be turned off, and the input stage 100 may not receive the third and the fourth differential currents I_N1 and I_N2 from the load stage 200.

In addition, according to an embodiment, when the input voltage VIN rises from a low level to a high level and the output voltage VOUT is at a low level, the internal PMOS transistors of the input stage 100 configured to receive the input voltage VIN may be turned off, and the internal PMOS transistor of the input stage 100 configured to receive the output voltage VOUT may be turned on, thereby the input stage 100 may provide the second differential current I_P2 to the load stage 200. On the other hand, the internal NMOS transistor of the input stage 100 configured to receive the input current VIN may be turned on, and the internal NMOS transistor of the input stage 100 configured to receive the output voltage VOUT may be turned off, thereby the input stage 100 may receive the third differential current I_N1 from the load stage 200.

In addition, according to an embodiment, when both the input voltage VIN and the output voltage VOUT are at a high level, the internal PMOS transistors of the input stage 100 configured to receive the input voltage VIN and the output voltage VOUT are turned off, and the input stage 100 may not be able to provide the first and the second differential currents I_P1 and I_P2 to the load stage 200. On the other hand, the internal NMOS transistor of the input stage 100 configured to receive the input current VIN and the output voltage VOUT may be turned on, and the input stage 100 may receive the third and the fourth differential currents I_N1 and I_N2 from the load stage 200.

In addition, according to an embodiment, when the input voltage VIN falls from a high level to a low level and the output voltage VOUT is at a high level, the internal PMOS transistors of the input stage 100 configured to receive the input voltage VIN are turned on, and the internal PMOS transistors of the input stage 100 configured to receive the output voltage VOUT are turned off, the input stage 100 may provide the first differential current I_P1 to the load stage 200. On the other hand, the internal NMOS transistor of the input stage 100 configured to receive the input current VIN is turned off, and the internal NMOS transistor of the input stage 100 configured to receive the output voltage VOUT is turned on, and the input stage 100 may receive the fourth differential current I_N2 from the load stage 200.

The input stage 100 may have a rail-to-rail structure that includes double input stages. The input stage 100 may be connected between the power supply voltage VDD and the ground voltage VSS.

The input stage 100 may be connected to a first bias circuit 130. The input stage 100 may receive a first bias current I_B1 from the first bias circuit 130 so that the internal PMOS transistor operates. Here, the first bias current I_B1 may serve as a constant current source, which maintains the sum of the first and the second differential currents I_P1 and I_P2 flowing in the internal PMOS transistor of the input stage 100 at a constant value.

The input stage 100 may be connected to a second bias circuit 140. The input stage 100 may provide a second bias current I_B2 to the second bias circuit 140 so that the internal NMOS transistor operates. Here, the second bias current I_B2 may serve as a constant current source, which maintains a sum of the third and the fourth differential currents I_N1 and I_N2 flowing in the internal NMOS transistor of the input stage 100 at a constant value. The first bias circuit 130 may be disposed between the power supply voltage VDD and the input stage 100 to be connected to the power supply voltage VDD and the input stage 100. As the constant current source, the first bias circuit 130 may provide a first bias current I_B1 to the input stage 100.

The second bias circuit 140 may be disposed between the ground voltage VSS and the input stage 100 to be connected to the ground voltage VSS and the input stage 100. As the constant current source, the second bias circuit 140 may receive the second bias current I_B2 from the input stage.

The load stage 200 may receive the first and the second differential currents I_P1 and I_P2 from the input stage 100. The load stage 200 may provide the third and the fourth differential currents I_N1 and I_N2 to the input stage 100. The load stage 200 may receive the first and the second differential currents I_P1 and I_P2 from the input stage 100 based on a difference between the input voltage VIN and the output voltage VOUT, and also, may provide the third and the fourth differential currents I_N1 and I_N2 to the input stage 100 based on a difference between the input voltage VIN and the output voltage VOUT.

The load stage 200 may increase or decrease a voltage of first and second output nodes PPG and PNG connected to gate terminals of the output transistors of the output stage 300 based on the first to the fourth differential currents I_P1, I_P2, I_N1 and I_N2. The load stage 200 may perform a current mirroring operation based on the first to fourth differential currents I_P1, I_P2, I_N1 and I_N2, and may make currents flow into the first and the second output nodes PPG and PNG connected to the gate terminals of the output transistors of the output stage 300, or make currents flow out from the first and the second output nodes PPG and PNG. When currents flow into the first and the second output nodes PPG and PNG connected to the gate terminals of the output transistors of the output stage 300, gate voltages of the output transistors may increase. On the other hand, when currents flow out from the first and the second output nodes PPG and PNG, the gate voltages of the output transistors may decrease.

The load stage 200 may amplify positively or negatively a voltage level of the second output node PNG connected to a second output transistor MNPWR of the output stage 300 based on a voltage difference between terminals configured to receive the first and the second differential currents I_P1 and I_P2. The load stage 200 may amplify positively or negatively a voltage level of the first output node PPG connected to a first output transistor MPPWR of the output stage 300 based on a voltage difference between terminals configured to provide the third and the fourth differential currents I_N1 and I_N2.

According to an embodiment, when the input voltage VIN rises from a low level to a high level, and the output voltage VOUT is at a low level, the load stage 200 may not receive the first differential current I_P1 from the input stage 100, but may receive the second differential current I_P2. The load stage 200 may perform a negative amplification that decreases a voltage of the second output node PNG connected to a gate terminal of the second output transistor MNPWR of the output stage 300 based on a difference between both currents. Also, the load stage 200 may provide the third differential current I_N1 to the input stage 100, but may not provide the fourth differential current I_N2 to the input stage 100. The load stage 200 may perform a negative amplification that decreases a voltage of the first output node PPG connected to a gate terminal of the first output transistor MPPWR of the output stage 300 based on a difference between both currents.

According to an embodiment, when the input voltage VIN falls from a high level to a low level, and the output voltage VOUT is at a high level, the load stage 200 may receive the first differential current I_P1 from the input stage 100, but may not receive the second differential current I_P2 from the input stage 100. The load stage 200 may perform a positive amplification that increases the voltage of the second output node PNG connected to the gate terminal of the second output transistor MNPWR of the output stage 300 based on a difference between both currents. Also, the load stage 200 may not provide the third differential current I_N1 to the input stage 100, but may provide the fourth differential current I_N2 to the input stage 100. The load stage 200 may perform a positive amplification that increases the voltage of the first output node PPG connected to the gate terminal of the first output transistor MPPWR of the output stage 300 based on a difference between both currents.

According to an embodiment, when the input voltage VIN rises, the load stage 200 may receive a first slew rate compensation current I_SR1 from the slew rate compensation circuit 400. In the load stage 200, the transistors of a first differential mirror circuit 210 of the load stage 200 may be turned off based on the first slew rate compensation current I_SR1. The first output node PPG may receive a current from the first differential mirror circuit 210 and may be connected to the first output transistor MPPWR of the output stage 300. When the transistors of the first differential mirror circuit 210 are turned off, the current transmitted from the first differential mirror circuit 210 to the first output node PPG may decrease, and the voltage of the first output node PPG may decrease. When the voltage of the first output node PPG, that is, the gate voltage of the first output transistor MPPWR of the output stage 300 decreases, a larger current may flow from the power voltage VDD to the output voltage VOUT and the slew rate for the rising transition of the output voltage VOUT may increase.

According to an embodiment, when the input voltage VIN falls, the load stage 200 may provide a second slew rate compensation current I_SR2 to the slew rate compensation circuit 400. Transistors of a second differential mirror circuit 220 of the load stage 200 may be turned off based on the second slew rate compensation current I_SR2. The second output node PNG may transmit a current to the second differential mirror circuit 220 and may be connected to the second output transistor MNPWR of the output stage 300. When the transistors of the second differential mirror circuit 220 are turned off, the current transmitted from the second output node PNG to the second differential mirror circuit 220 may decrease, and the voltage of the second output node PNG may increase. When the voltage of the second output node PNG, that is, the gate voltage of the second output transistor MNP WR of the output stage 300 increases, a larger current may flow from the output voltage VOUT to the ground voltage VSS, and the slew rate of the falling transition of the output voltage VOUT may increase.

As the voltages of the nodes connected to the load stage 200 increase or decrease, the gate voltages of the output transistors of the output stage 300 may increase or decrease. When the gate voltages of the output transistors of the output stage 300 increase, the output voltage VOUT of the output stage 300 may decrease. On the other hand, when the gate voltages of the output transistors of the output stage 300 decrease, the output voltage VOUT of the output stage 300 may increase.

According to an embodiment, as described above, when the input voltage VIN rises from a low level to a high level, and the output voltage VOUT is at a low level, the voltage of the first output node PPG connected to the gate terminal of the first output transistor MPPWR of the output stage 300 may decrease. The first output transistor MPPWR is configured with the PMOS transistor, and may perform a turn-on operation as the voltage of the first output node PPG, that is, the gate voltage of the first output transistor MPPWR decreases, and a voltage level of the output voltage VOUT may increase as a current flows to an output terminal from the power supply voltage. In addition, the voltage of the second output node PNG connected to the gate terminal of the second output transistor MNPWR of the output stage 300 may decrease. The second output transistor MNPWR is configured with the NMOS transistor and may perform a turn-off operation as a gate voltage for the second output node PNG. That is, the gate voltage of the second output transistor MNPWR decreases, and since a current does not flow to ground voltage from the output terminal, the voltage level of the output voltage VOUT may increase.

According to an embodiment, as described above, when the input voltage VIN falls from a high level to a low level, and the output voltage VOUT is at a high level, the voltage of the first output node PPG connected to the gate terminal of the first output transistor MPPWR of the output stage 300 may increase. The first output transistor MPPWR is configured with the PMOS transistor, and may perform a turn-off operation as the voltage of the first output node PPG, that is, the gate voltage of the first output transistor MPPWR increases, and the voltage level of the output voltage VOUT may decrease as a current does not flow to the output terminal from the power supply voltage VDD. In addition, the voltage of the second output node PNG connected to the gate terminal of the second output transistor MNPWR of the output stage 300 may increase. The second output transistor MNPWR is configured with the NMOS transistor, and may perform a turn-on operation as the gate voltage of the second output transistor MNPWR increases, and the voltage level of the output voltage VOUT may decrease as a current flows to ground voltage from the output terminal.

By comparing the input voltage VIN to the output voltage VOUT, the slew rate compensation circuit 400 may provide the first slew rate compensation current I_SR1 to the load stage 200, or may receive the second slew rate compensation current I_SR2 from the load stage 200.

The slew rate compensation circuit 400 may include a first slew rate compensation circuit 410 and a second slew rate compensation circuit 420.

The first slew rate compensation circuit 410 may have a current source such that the first slew rate compensation current I_SR1 is provided to the load stage 200, when a voltage difference between the input voltage VIN in a rising transition and the output voltage VOUT following the input voltage VIN is equal to or more than a first reference voltage. Here, the first reference voltage means a threshold voltage of the MOS transistor of a first comparator N_comp of the first slew rate compensation circuit 410.

As described above, because of the first slew rate compensation current I_SR1 provided by the first slew rate compensation circuit 410 to the load stage 200, the slew rate of a rising transition of the output voltage VOUT may increase.

The second slew rate compensation circuit 420 may have a current source such that the second slew rate compensation current I_SR2 is received from the load stage 200, when a voltage difference between the input voltage VIN in a falling transition and the output voltage VOUT following the input voltage VIN is equal to or more than a second reference voltage. Here, the second reference voltage means a threshold voltage of the MOS transistor of a second comparator P_comp of the second slew rate compensation circuit 420.

As described above, because of the second slew rate compensation current I_SR2 received by the second slew rate compensation circuit 420 from the load stage 200, a slew rate of a falling transition of the output voltage VOUT may increase.

The offset blocking circuit 500 may include a first switch 510 configured to turn off a current source of the first slew rate compensation circuit 410 by a first offset control signal SRB_OFF_RISING 710, and a second switch 520 configured to turn off a current source of the second slew rate compensation circuit 420 by a second offset control signal SRB_OFF_FALLING 720.

The offset control signal output stage 700 may turn on the first switch 510 and turn off the current source of the first slew rate compensation circuit 410 by generating the first offset control signal SRB_OFF_RISING 710 at a low level after a predetermined time elapses since a time point when an H section at which the input voltage VIN rises starts according to an N-bit control signal. That is, according to the N-bit control signal, the offset blocking circuit 500 may adjust a timing for blocking a current provided to the load stage 200 from the first slew rate compensation circuit 410 after the predetermined time elapses since the time point when the H section at which the input voltage VIN rises starts.

The offset control signal output stage 700 may turn on the second switch 520 and turn off the current source of the second slew rate compensation circuit 420 by generating the second offset control signal SRB_OFF_FALLING 720 at a high level after a predetermined time elapses since a time point when an H section at which the input voltage VIN falls starts according to the N-bit control signal. That is, according to the N-bit control signal, the offset blocking circuit 500 may adjust a timing for blocking a current provided to the second slew rate compensation circuit 420 from the load stage 200 after the predetermined time elapses since the time point when the H section at which the input voltage VIN falls starts.

Therefore, it is possible to suppress the overshoot or undershoot in the transient response state that may occur in the operation of the rising or falling transition of the output voltage VOUT and eliminate the occurrence of noise, such as the parasitic current caused by the compensation circuit in the normal state.

Hereinafter, referring to FIGS. 2 to 6, a detailed structure of the buffer circuit 1000 according to an embodiment of the present disclosure will be described.

Referring to FIGS. 2 and 3, the input stage 100 may include a first input stage 110 configured with the PMOS transistors P_I1 and P_I2, a second input stage 120 configured with the NMOS transistors N_I1 and N_I2, a first bias circuit 130 configured to provide a first bias current I_B1 to the first input stage 110, and a second bias circuit 140 configured to receive a second bias current I_B2 from the second input stage 120.

The first input stage PMOS transistor P_I1 may have a gate configured to receive the input voltage VIN, a source connected to the first bias circuit 130 in common with the second input stage PMOS transistor P_I2, and a drain connected to the second differential mirror circuit 220 of the load stage 200. The first input stage PMOS transistor P_I1 may provide the first differential current I_P1 based on the input voltage VIN to a drain of a second load stage NMOS transistor MN2 of the second differential mirror circuit 220 of the load stage 200.

The second input stage PMOS transistor P_I2 may have a gate configured to receive the output voltage VOUT, a source connected to the first bias circuit 130 in common with the first input stage PMOS transistor P_I1, and a drain connected to the second differential mirror circuit 220 of the load stage 200. The second input stage PMOS transistor P_I2 may provide the second differential current I_P2 based on the output voltage VOUT to a drain of a first load stage NMOS transistor MN1 of the second differential mirror circuit 220 of the load stage 200.

When the input voltage VIN and the output voltage VOUT are equal, the first differential current I_P1 and the second differential current I_P2, each having the same current value, are provided to the load stage 200. When there is a difference between the input voltage VIN and the output voltage VOUT, the first differential current I_P1 and the second differential current I_P2, each having a difference in the current value in proportion to the difference therebetween, are provided to the load stage 200.

According to an embodiment, when the input voltage VIN changes to "L" (e.g., VSS), in a state in which the input voltage VIN and the output voltage VOUT are both "H" (e.g., VDD), a voltage difference between the gate and source of the first input stage PMOS transistor P_I1, that is, a difference between the input voltage VIN and the output voltage VOUT, becomes greater than a threshold voltage, the first input stage PMOS transistor P_I1 is turned on and a current flows therein, therefore, the first differential current I_P1 has a value greater than 0. The first differential current I_P1 may become greater as the input voltage VIN is lowered. At this time, the second differential current I_P2 may continue to be 0 in a section at which the output voltage VOUT does not change from "H".

According to another embodiment, when the input voltage VIN changes to "H" in a state in which the input voltage VIN and the output voltage VOUT are both "L", the voltage between the gate and the source of the first input stage PMOS transistor P_I1 (a difference between the input voltage VIN and the power supply voltage VDD) gradually decreases. Accordingly, the first differential current I_P1 decreases. When the voltage between them becomes smaller than the threshold voltage, the first differential current I_P1 becomes 0. At this time, the second differential current I_P2 may increase by as much as the decrease of the first differential current I_P1. This is because the sum of the first and the second differential current I_P1 and I_P2 is identical to the first bias current I_B1.

The second input stage 120 may be configured with the first input stage NMOS transistor N_I1, and the second input stage NMOS transistor N_I2.

The first input stage NMOS transistor N_I1 may have a gate configured to receive the input voltage VIN, a source connected to the second bias circuit 140 in common with the second input stage NMOS transistor N_I2, and a drain connected to the first differential mirror circuit 210 of the load stage 200. The first input stage NMOS transistor N_I1 may receive the third differential current I_N1 based on the input voltage VIN from a drain of a second load stage PMOS transistor MP2 of the first differential mirror circuit 210 of the load stage 200.

The second input stage NMOS transistor N_I2 may have a gate configured to receive the output voltage VOUT, a source connected to the second bias circuit 140 in common with the first input stage NMOS transistor N_I1, and a drain connected to the first differential mirror circuit 210 of the load stage 200. The second input stage NMOS transistor N_I2 may receive the fourth differential current I_N2 based on the output voltage VOUT from a drain of a first load stage PMOS transistor MP1 of the first differential mirror circuit 210 of the load stage 200.

When the input voltage VIN and the output voltage VOUT are equal, the second input stage 120 receives the third differential current I_N1 and the fourth differential current I_N2, each having the same current value from the load stage 200; however, when there is a difference between the input voltage VIN and the output voltage VOUT, there may occur a difference between the current values of the third differential current I_N1 and the fourth differential current I_N2 received from load stage 200, which is in proportion to the difference therebetween. Therefore, information on the difference between the input voltage VIN and the output voltage VOUT may be provided to the load stage 200.

According to an embodiment, when the input voltage VIN changes to "H" in a state in which the input voltage VIN and the output voltage VOUT are both "L", a voltage difference between the gate and source of the first input stage NMOS transistor N_I1, that is, a difference between the input voltage VIN and the ground voltage VSS becomes greater than the threshold voltage, the first input stage NMOS transistor N_I1 is turned on and a current flows therein, therefore, the third differential current I_N1 has a value greater than 0. The third differential current I_N1 may become greater as the input voltage VIN increases. At this time, the fourth differential current I_N2 may continue to be 0 in a section at which the output voltage VOUT does not change from "L".

According to another embodiment, when the input voltage VIN changes to "L" in a state in which the input voltage VIN and the output voltage VOUT are both "H", the voltage between the gate and the source of the first input stage NMOS transistor N_I1 (a difference between the input voltage VIN and the ground voltage VSS) gradually decreases. Accordingly, the third differential current I_N1 decreases, and when the voltage therebetween becomes smaller than the threshold voltage, the third differential current I_N1 becomes 0. At this time, the fourth differential current I_N2 may increase by as much as the decrease of the third differential current I_N1. This is because the sum of the third and the fourth differential currents I_N1 and I_N2 is identical to the second bias current I_B2.

Referring to FIG. 3, the load stage 200 may include a first differential mirror circuit 210, a second differential mirror circuit 220, a third bias circuit 230, and a fourth bias circuit 240.

According to an embodiment, the first differential mirror circuit 210 may have a cascode structure, and may perform a current mirroring operation.

The first differential mirror circuit 210 may serve as a constant current source, supply currents to the input stage 100, the third bias circuit 230, and the fourth bias circuit 240, and apply a voltage to the gate terminals of the first output transistor MPPWR and the second output transistor MNPWR of the output stage 300.

The first differential mirror circuit 210 may include a first load stage PMOS transistor MP1 and a second load stage PMOS transistor MP2 configured to perform a current mirroring operation, and a third load stage PMOS transistor MP3 and a fourth load stage PMOS transistor MP4 connected to the first load stage PMOS transistor MP1 and the second load stage PMOS transistor MP2 in series to form a cascode structure so that a high voltage gain is obtained.

In more detail, the first load stage PMOS transistor MP1 of the first differential mirror circuit 210 may have a gate connected to the third bias circuit 230 in common with the second load stage PMOS transistor MP2, a drain connected to the third load stage PMOS transistor MP3, and a source connected to the power supply voltage VDD. The first slew rate compensation current I_SR1 may be provided from the first slew rate compensation circuit 410 to a third node ND3 positioned between the drain of the first load stage PMOS transistor MP1 and the source of the third load stage PMOS transistor MP3.

The second load stage PMOS transistor MP2 of the first differential mirror circuit 210 may have a gate connected to the third bias circuit 230 in common with the first load stage PMOS transistor MP1, a drain connected to the fourth load stage PMOS transistor MP4, and a source connected to the power supply voltage VDD.

The third load stage PMOS transistor MP3 of the first differential mirror circuit 210 may be connected between the third bias circuit 230 and the first load stage PMOS transistor MP1. The third load stage PMOS transistor MP3 may have a gate configured to receive a second bias voltage VB2, a drain connected to the third bias circuit 230, and a source connected to the first load stage PMOS transistor MP1.

The fourth load stage PMOS transistor MP4 of the first differential mirror circuit 210 may be connected between the fourth bias circuit 240 and the second load stage PMOS transistor MP2. The fourth load stage PMOS transistor MP4 may have a gate configured to receive the second bias voltage VB2, a drain in which the first output node PPG is connected to the fourth bias circuit 240 and a gate terminal of the first output transistor MPPWR of the output stage 300 is positioned, and a source connected to the second load stage PMOS transistor MP2.

According to an embodiment, the second differential mirror circuit 220 may have a cascode structure, and may perform a current mirroring operation.

The second differential mirror circuit 220 may serve as a constant current source, receive currents from the third bias circuit 230 and the fourth bias circuit 240, and apply a voltage to the gate terminal of the first output transistor MPPWR and the second output transistor MNPWR of the output stage 300.

The second differential mirror circuit 220 may include the first load stage NMOS transistor MN1 and the second load stage NMOS transistor MN2 configured to perform a current mirroring operation, and a third load stage NMOS transistor MN3 and a fourth load stage NMOS transistor MN4 connected to the first load stage NMOS transistor MN1 and the second load stage NMOS transistor MN2 in series to form a cascode structure so that a high voltage gain is obtained.

In more detail, the first load stage NMOS transistor MN1 of the second differential mirror circuit 220 may have a gate connected to the third bias circuit 230 in common with the second load stage NMOS transistor MN2, a drain connected to the third load stage NMOS transistor MN3, and a source connected to the ground voltage VSS. The second slew rate compensation current I_SR2 may be provided from a fourth node ND4 positioned between a drain of the first load stage NMOS transistor MN1 and a source of the third load stage NMOS transistor MN3 to the second slew rate compensation circuit 420.

The second load stage NMOS transistor MN2 of the second differential mirror circuit 220 may have a gate connected to the third bias circuit 230 in common with the first load stage NMOS transistor MN1, a drain connected to the fourth load stage NMOS transistor MN4, and a source connected to the ground voltage VSS.

The third load stage NMOS transistor MN3 of the second differential mirror circuit 220 may be connected between the third bias circuit 230 and the first load stage NMOS transistor MN1. The third load stage NMOS transistor MN3 may have a gate configured to receive a fifth bias voltage VB5, a drain connected to the third bias circuit 230, and a source connected to the first load stage NMOS transistor MN1.

The fourth load stage NMOS transistor MN4 of the second differential mirror circuit 220 may be connected between the fourth bias circuit 240 and the second load stage NMOS transistor MN2. The fourth load stage NMOS transistor MN4 may have a gate configured to receive the fifth bias voltage VB5, a drain in which the second output node PNG connected to the fourth bias circuit 240 and the gate terminal of the second output transistor MNPWR is positioned, and a source connected to the second load stage NMOS transistor MN2.

The third bias circuit 230 may include a plurality of transistors MPF1, MNF1 and MNF2. The third bias circuit 230 may be positioned between the first differential mirror circuit 210 and the second differential mirror circuit 220. The third bias circuit 230 may control an operation in a static state and an amplification operation of the first differential mirror circuit 210 and the second differential mirror circuit 220. In addition, the third bias circuit 230 may be used as a floating current source.

The fourth bias circuit 240 may include a plurality of transistors MPC1, MNC1, and MNC2. The fourth bias circuit 240 may be positioned between the first differential mirror circuit 210 and the second differential mirror circuit 220. The fourth bias circuit 240 may control an operation in a static state and an amplification operation of the first differential mirror circuit 210 and the second differential mirror circuit 220. In addition, the fourth bias circuit 240 may be used as a floating current source.

The slew rate compensation circuit 400 may include the first slew rate compensation circuit 410 and the second slew rate compensation circuit 420.

The first slew rate compensation circuit 410 may include the first comparator N_comp, a first current source I_S1, a first slew rate transistor M_SP1, and a second current source I_S2.

The first comparator N_comp may include an NMOS transistor having a gate configured to receive the input voltage VIN, a drain connected to a first node ND1, and a source configured to receive the output voltage VOUT. The first comparator N_comp may compare a difference between the input voltage VIN and the output voltage VOUT, and get to a turn-on or a turn-off operation state based on the difference between the input voltage VIN and the output voltage VOUT. A threshold voltage of the NMOS transistor of the first comparator N_comp may be referred to as the first reference voltage. The first comparator N_comp may get to a turn-on operation state when a difference between the input voltage VIN in a rising transition and the output voltage VOUT is equal to or more than the first reference voltage.

The first current source I_S1 may generate a first slew rate compensation circuit operation current based on a voltage difference between the power supply voltage VDD and the first node ND1 when the NMOS transistor of the first comparator N_comp performs a turn-on operation. The first slew rate compensation circuit operation current generated in the first current source I_S1 may be provided to the first slew rate transistor M_SP1 through the first node ND1.

The first slew rate transistor M_SP1 may receive the first slew rate compensation circuit operation current through the gate terminal by being connected to the first node ND1, and perform a turn-on operation based on the first slew rate compensation circuit operation current. By the turn-on operation of the first slew rate transistor M_SP1, the first slew rate compensation current I_SR1 may be provided to the load stage 200 from the second current source I_S2.

The second current source I_S2 may generate the first slew rate compensation current I_SR1 based on the power supply voltage VDD, and provide the first slew rate compensation current I_SR1 to the load stage 200 by the turn-on operation of the first slew rate transistor M_SP1. The first slew rate compensation current I_SR1 may be provided to the load stage 200. When the first slew rate compensation current I_SR1 is provided to the load stage 200, a slew rate of a rising transition of the output voltage VOUT with respect to the input voltage VIN in a rising transition may increase.

The second slew rate compensation circuit 420 may include the second comparator P_comp, a third current source I_S3, a second slew rate transistor M_SN1, and a fourth current source I_S4.

The second comparator P_comp may include a PMOS transistor having a gate configured to receive the input voltage VIN, a drain connected to a second node ND2, and a source configured to receive the output voltage VOUT. The second comparator P_comp may compare a difference between the input voltage VIN and the output voltage VOUT, and get to a turn-on or a turn-off operation state based on the difference between the input voltage VIN and the output voltage VOUT. A threshold voltage of the PMOS transistor of the second comparator P_comp may be referred to as the second reference voltage. The second comparator P_comp may get to a turn-on operation state when a difference between the input voltage VIN in a falling transition and the output voltage VOUT is equal to or more than the second reference voltage.

The third current source I_S3 may generate a second slew rate compensation circuit operation current flowing based on a voltage difference between the ground voltage VSS and the second node ND2 when the PMOS transistor of the second comparator P_comp performs a turn-on operation. The second slew rate compensation circuit operation current generated in the third current source I_S3 may be provided to the second slew rate transistor M_SN1 through the second node ND2.

The second slew rate transistor M_SN1 may receive the second slew rate compensation circuit operation current through the gate terminal by being connected to the second node ND2, and perform a turn-on operation based on the second slew rate compensation circuit operation current. By the turn-on operation of the second slew rate transistor M_SN1, the fourth current source I_S4 may receive the second slew rate compensation current I_SR2 from the load stage 200.

The fourth current source I_S4 may generate the second slew rate compensation current I_SR2 based on the ground voltage VSS, and receive the second slew rate compensation current I_SR2 from the load stage 200 by the turn-on operation of the second slew rate transistor M_SN1. When the second slew rate compensation current I_SR2 is provided from the load stage 200, a slew rate of a falling transition of the output voltage VOUT with respect to the input voltage VIN of a falling transition may increase.

According to an embodiment, the first slew rate compensation circuit 410 may provide the first slew rate compensation current I_SR1 to the third node ND3 of the first differential mirror circuit 210. The voltage of the third node ND3 may increase by the first slew rate compensation current I_SR1. A difference between the increased voltage of the third node ND3 and the power supply voltage VDD may be less than a threshold voltage of the first load stage PMOS transistor MP1, and accordingly, the first load stage PMOS transistor MP1 may be turned off, and the current may not flow therein. When the first load stage PMOS transistor MP1 is turned off, the second load stage PMOS transistor MP2 having a mirroring structure may be turned off as well. As the second load stage PMOS transistor MP2 is turned off, the current may not be provided to the first output mode PPG. When the current is not provided to the first output node PPG, the voltage of the first output node PPG may decrease, that is, a gate voltage of the first output transistor MPPWR of the output stage 300 may decrease. When the gate voltage of the first output transistor MPPWR decreases, a push current I_Push flowing from the first output transistor MPPWR to the output terminal may increase, the output voltage VOUT output from the output terminal may rapidly increase, and become able to rapidly follow a rising transition of the input voltage VIN.

According to an embodiment, the second slew rate compensation circuit 420 may receive the second slew rate compensation current I_SR2 from the fourth node ND4 of the second differential mirror circuit 220. The voltage of the fourth node ND4 may decrease by the second slew rate compensation current I_SR2. The voltage difference between the decreased voltage of the fourth node ND4 and the ground voltage VSS may be less than a threshold voltage of the first load stage NMOS transistor MN1, and accordingly, the first load stage NMOS transistor MN1 may be turned off, and the current may not flow therein. When the first load stage NMOS transistor MN1 is turned off, the second load stage NMOS transistor MN2 having a mirroring structure may be turned off as well. The second load stage NMOS transistor MN2 may be turned off and the current may not be provided from the second output node PNG to the ground voltage VSS. When the current is not provided to the ground voltage VSS from the second output node PNG, the voltage of the second output node PNG may increase, that is, the gate voltage of the second output transistor MNPWR of the output stage 300 may increase. When the gate voltage of the second output transistor MNPWR increases, a pull current I_Pull flowing from the output terminal to the second output transistor MNPWR may increase, the output voltage VOUT output from the output terminal may rapidly decrease, and become able to rapidly follow a falling transition of the input voltage VIN.

Referring to FIG. 4, according to another embodiment, the first slew rate compensation circuit 410 of the buffer circuit 1000 may provide the first slew rate compensation current I_SR1 by being connected to a fifth node ND5 of the load stage 200, and the second slew rate compensation circuit 420 may receive the second slew rate compensation current I_SR2 by being connected to a sixth node ND6 of the load stage 200.

The buffer circuit 1000 illustrated in FIG. 4 has only a difference of the fifth node ND5 of the load stage 200 connected to the first slew rate compensation circuit 410, and the sixth node ND6 of the load stage 200 connected to the second slew rate compensation circuit 420, and the other component is the same as the structure of the buffer circuit 1000 illustrated in FIG. 3. Hereinafter, the description will focus on a configuration that differs depending on whether the first slew rate compensation current I_SR1 is provided to the fifth node ND5, or where the second slew rate compensation current I_SR2 is provided from the sixth node ND6.

According to another embodiment, the first slew rate compensation circuit 410 may provide the first slew rate compensation current I_SR1 to the fifth node ND5 of the first differential mirror circuit 210. The voltage of the fifth node ND5 may increase by the first slew rate compensation current I_SR1. The fifth node ND5 may be connected to a gate terminal of the first load stage PMOS transistor MP1, and when the voltage of the fifth node ND5 increases, that is, when a gate voltage of the first load stage PMOS transistor MP1 increases, the first load stage PMOS transistor MP1 may be turned off. Accordingly, the first load stage PMOS transistor MP1 is turned off, and the current may not flow therein. When the first load stage PMOS transistor MP1 is turned off, the second load stage PMOS transistor MP2 having a mirroring structure may be turned off as well. The second load stage PMOS transistor MP2 is turned off, and the current may not be provided to the first output node PPG. When the current is not provided to the first output node PPG, the voltage of the first output node PPG may decrease, that is, the gate voltage of the first output transistor MPPWR of the output stage 300 may decrease. When the gate voltage of the first output transistor MPPWR decreases, the push current I_Push flowing from the first output transistor MPPWR to the output terminal may increase, the output voltage VOUT output from the output terminal may rapidly increase, and become able to rapidly follow a rising transition of the input voltage VIN.

According to another embodiment, the second slew rate compensation circuit 420 may receive the second slew rate compensation current I_SR2 from the sixth node ND6. A voltage of the sixth node ND6 may decrease by the second slew rate compensation current I_SR2. The sixth node ND6 is connected to a gate terminal of the first load stage NMOS transistor MN1, and when the voltage of the sixth node ND6 decreases, that is, a gate voltage of the first load stage NMOS transistor MN1 decreases, the first load stage NMOS transistor MN1 may be turned off. Accordingly, the first load stage NMOS transistor MN1 may be turned off, and the current may not flow therein. When the first load stage NMOS transistor MN1 is turned off, the second load stage NMOS transistor MN2 having a mirroring structure may be turned off as well. The second load stage NMOS transistor MN2 is turned off, and the current may not be provided from the second output node PNG to the ground voltage VSS. When the current is not provided from the second output node PNG to the ground voltage VSS, the voltage of the second output node PNG may increase, that is, the gate voltage of the second output transistor MNPWR of the output stage 300 may increase. When the gate voltage of the second output transistor MNPWR increases, the pull current I_Pull flowing from the output terminal to the second output transistor MNPWR may increase, the output voltage VOUT output from the output terminal may rapidly decrease, and become able to follow a falling transition of the input voltage VIN.

Referring to FIG. 5, according to another embodiment, the first slew rate compensation circuit 410 of the buffer circuit 1000 may provide the first slew rate compensation current I_SR1 by being connected to a seventh node ND7 of the load stage 200, and the second slew rate compensation circuit 420 may receive the second slew rate compensation current I_SR2 by being connected to an eighth node ND8 of the load stage 200.

The buffer circuit 1000 illustrated in FIG. 5 has only a difference of the seventh node ND7 of the load stage 200 connected to the first slew rate compensation circuit 410, and the eighth node ND8 of the load stage 200 connected to the second slew rate compensation circuit 420, and the other component is the same as the structure of the buffer circuit 1000 illustrated in FIG. 3. Hereinafter, the description will focus on a configuration that differs depending on whether the first slew rate compensation current I_SR1 is provided to the seventh node ND7, or whether the second slew rate compensation current I_SR2 is provided from the eighth node ND8.

According to still another embodiment, the first slew rate compensation circuit 410 may provide the first slew rate compensation current I_SR1 to the seventh node ND7 of the first differential mirror circuit 210. The voltage of the seventh node ND7 may increase by the first slew rate compensation current I_SR1. A voltage difference between the increased seventh node ND7 and the power supply voltage VDD may be less than a threshold voltage of the second load stage PMOS transistor MP2. Accordingly, the second load stage PMOS transistor MP2 may be turned off, and the current may not flow therein. The second load stage PMOS transistor MP2 may be turned off, and the current may not be provided to the first output node PPG. When the current is not provided to the first output node PPG, the voltage of the first output node PPG may decrease, that is, the gate voltage of the first output transistor MPPWR of the output stage 300 may decrease. When the gate voltage of the first output transistor MPPWR decreases, the push current I_Push flowing from the first output transistor MPPWR to the output terminal may increase, the output voltage VOUT output from the output terminal may rapidly increase, and become able to rapidly follow a rising transition of the input voltage VIN.

According to another embodiment, the second slew rate compensation circuit 420 may receive the second slew rate compensation current I_SR2 from the eighth node ND8 of the second differential mirror circuit 220. The voltage of the eighth node ND8 may decrease by the second slew rate compensation current I_SR2. A voltage difference between the decreased eighth node ND8 and the ground voltage VSS may be less than a threshold voltage of the second load stage NMOS transistor MN2. Accordingly, the second load stage NMOS transistor MN2 may be turned off, and the current may not flow therein. The second load stage NMOS transistor MN2 may be turned off, and the current may not be provided from the second output node PNG to the ground voltage VSS. When the current is not provided from the second output node PNG to the ground voltage VSS, the voltage of the second output node PNG may increase, that is, the gate voltage of the second output transistor MNPWR of the output stage 300 may increase. When the gate voltage of the second output transistor MNPWR increases, the pull current I_Pull flowing from the output terminal to the second output transistor MNPWR may increase, the output voltage VOUT output from the output terminal may rapidly decrease, and become able to rapidly follow a falling transition of the input voltage VIN.

Referring to FIG. 3 again, the output stage 300 may include the first and the second output transistors MPPWR and MNPWR, as well as the first and second compensation capacitors C1 and C2.

The first output transistor MPPWR may have a gate connected to the first output node PPG of the first differential mirror circuit 210 of the load stage 200, a source connected to the power supply voltage VDD, and a drain connected to the output voltage VOUT. Based on the voltage of the first output node PPG connected to the gate of the first output transistor MPPWR, the current flowing in the first output transistor MPPWR may be changed.

The second output transistor MNPWR may have a gate connected to the second output node PNG of the second differential mirror circuit 220 of the load stage 200, a source connected to the ground voltage VSS, and a drain connected to the out voltage VOUT. Based on the voltage of the second output node PNG connected to the gate of the second output transistor MNPWR, the current flowing in the second output transistor MNPWR may be changed.

When the gate voltages of the first and the second output transistors MPPWR and MNPWR of the output stage 300 increase, the output voltage VOUT of the output stage 300 may decrease. On the other hand, when the gate voltages of the first and the second output transistors MPPWR and MNPWR of the output stage 300 decrease, the output voltage VOUT of the output stage 300 may increase.

According to an embodiment, the first output transistor MPPWR is configured with the PMOS transistor, and when the gate voltage decreases, the push current I_Push flowing from the first output transistor MPPWR to the output terminal may increase, the output voltage VOUT output from the output terminal may rapidly increase, and become able to rapidly follow a rising transition of the input voltage VIN.

According to an embodiment, the second output transistor MNPWR is configured with the NMOS transistor, and when the gate voltage increases, the pull current I_Pull flowing from the output terminal to the second output transistor MNPWR may increase, and as the pull current I_Pull flowing from the output terminal increases, the output voltage VOUT output from the output terminal may rapidly decrease, and become able to rapidly follow a falling transition of the input voltage VIN.

The first compensation capacitor C1 may have one end connected to the output voltage VOUT, and the other end connected to the first differential mirror circuit 210. The second compensation capacitor C2 may have one end connected to the output voltage VOUT, and the other end connected to the second differential mirror circuit 220. Based on charge and discharge rates of the first compensation capacitor C1 and the second compensation capacitor C2, the slew rate of the output voltage VOUT with respect to the input voltage VIN may increase or decrease.

FIG. 6 is a circuit diagram illustrating the offset blocking circuit and the offset control signal output stage according to an embodiment of the present disclosure.

The offset control signal output stage 700 may receive a first N-bit control signal 730 and a second N-bit control signal 740 to output a first offset control signal SRB_OFF_RISING 710 and a second offset control signal SRB_OFF_FALLING 720.

The offset blocking circuit 500 may include the first switch 510 and the second switch 520.

The first switch 510 may include the PMOS transistor having a gate configured to receive a first offset control signal 710, a source connected to the power supply voltage VDD, and a drain connected to the first node ND1 of the first slew rate compensation circuit 410.

The second switch 520 may include the NMOS transistor having a gate configured to receive a second offset control signal 720, a drain connected to the second node ND2 of the second slew rate compensation circuit 420, and a source connected to the ground voltage VSS.

Figure 7:
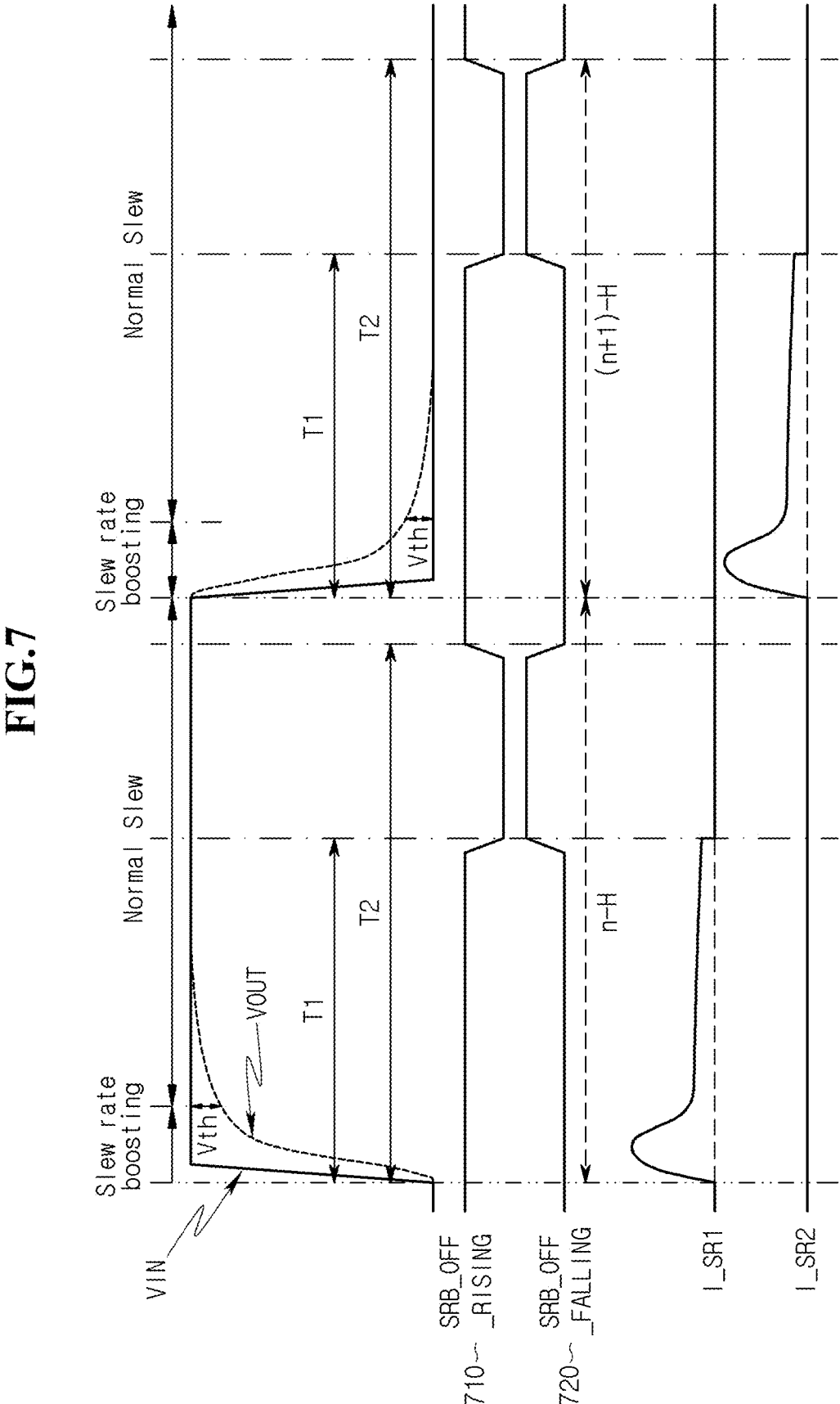
FIG. 7 is a view illustrating operation waveforms of an offset blocking circuit and an offset control signal output stage according to an embodiment of the present disclosure.
Figure 8:
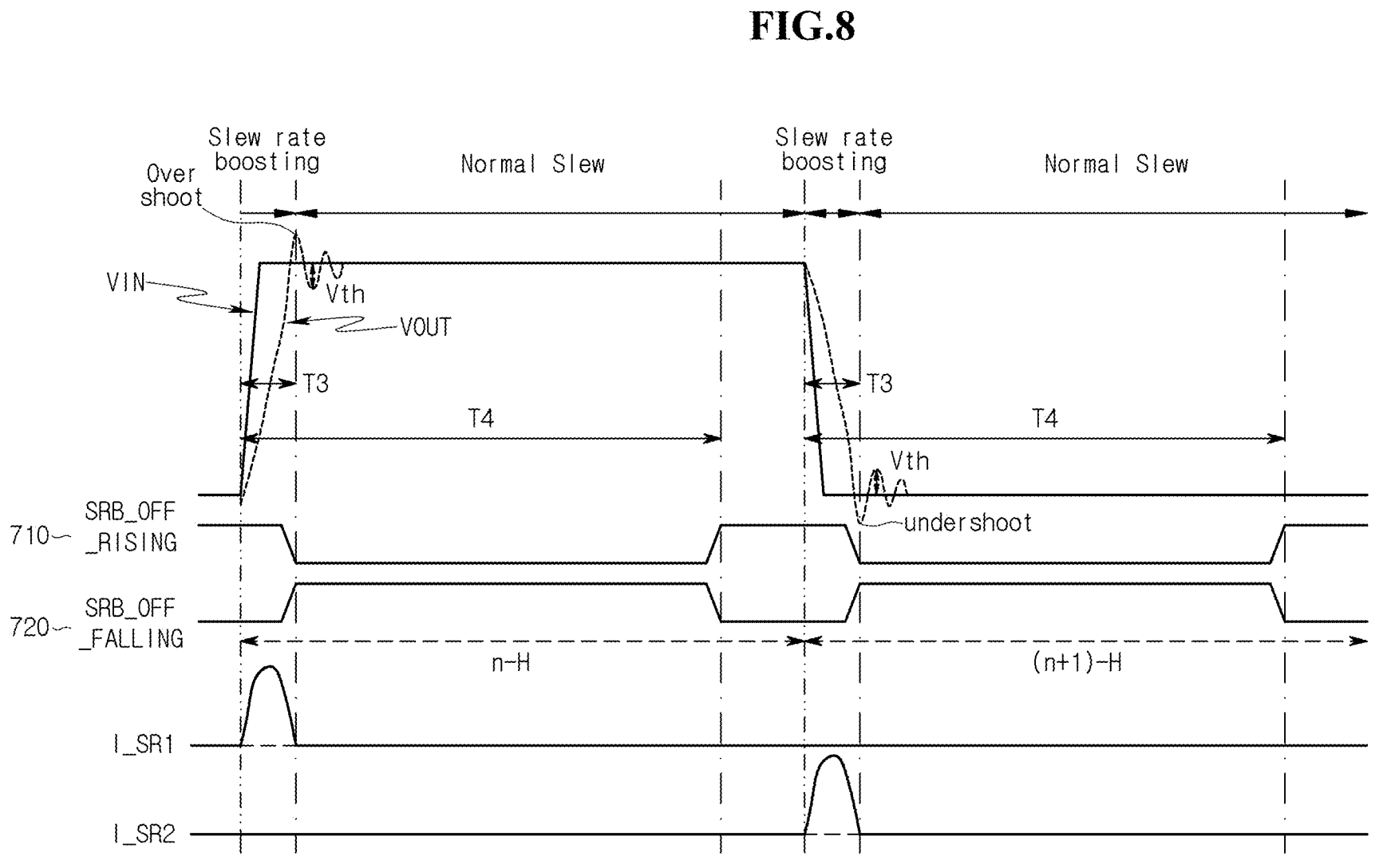

FIGS. 7 and 8 are views illustrating operation waveforms of the offset blocking circuit and the offset control signal output stage according to an embodiment of the present disclosure.

Referring to FIGS. 7 and 8, the offset control signal output stage 700 may receive the first N-bit control signal 730 and the second N-bit control signal 740 to generate the first offset control signal 710 and the second offset control signal 720. A timing in which the first offset control signal 710 and the second offset control signal 720 get to a high level or a low level in 1H time may be changed based on the first and the second N-bit control signals 730 and 740, which are logic signals.

FIGS. 7 and 8 are embodiments representing a timing in which the first offset control signal 710 and the second offset control signal 720 get to a high or a low level according to the first and second 2-bit control signals 730 and 740. As the first and the second 2-bit control signals 730 and 740 change to "00, 01, 10, 11", a timing in which the first offset control signal 710 and the second offset control signal 720 get to a high level or a low level in 1H time may be changed.

In addition, because a timing in which the first offset control signal 710 and the second offset control signal 720 get to a high level or a low level is changed according to the first and the second N-bit control signals 730 and 740, which are logic signals, it is possible to eliminate an offset of the output voltage according to a predetermined time without the variation of a process, a voltage, and a temperature (PVT), compared to the control of transistors which has been used in the conventional analog mode.

According to an embodiment, the first offset control signal 710 and the second offset control signal 720 may be inverted relative to each other. The offset control signal output stage 700 may generate the first offset control signal 710 according to the first and the second N-bit control signals 730 and 740, and may generate the second offset control signal 720 by inverting the first offset control signal 710. However, the present disclosure is not limited thereto, and the offset control signal output stage 700 may respectively generate the first and the second offset control signals 710 and 720 according to the first and the second N-bit control signals 730 and 740.

Referring to FIG. 7, the offset control signal output stage 700 may set a timing in which the first and the second offset control signals 710 and 720 get to a high level or a low level as the first and the second N-bit control signals 730 and 740 are set to "11". The offset control signal output stage 700 may set a first predetermined time T1 according to "11" which is the first 2-bit control signal 730, and may set a second predetermined time T2 according to "11" which is the second 2-bit control signal 740.

According to an embodiment, an n-th H section(n–H) is a section at which the input voltage VIN is in a rising transition. The offset control signal output stage 700 may turn on the first switch 510 by outputting the first offset control signal 710, having a low level to the offset blocking circuit 500, after the first predetermined time T1 elapses since a time point when the n-th H section(n–H) starts.

According to an embodiment, the offset control signal output stage 700 may turn off the first switch 510 by outputting the first offset control signal 710 having a high level to the offset blocking circuit 500 after the second predetermined time T2 elapses since the time point when the n-th H section (n–H) starts.

According to an embodiment, when the first switch 510 performs a turn-on operation, it is possible to turn off the current source of the first slew rate compensation circuit 410 since a voltage of the same level as the power supply voltage VDD is generated in the first node ND1 of the first slew rate compensation circuit 410.

According to an embodiment, an n+1 th H section ((n+1)–H) is a section at which the input voltage VIN is in a falling transition. The offset control signal output stage 700 may turn on the second switch 520 by outputting the second offset control signal 720 having a high level to the offset blocking circuit 500 after the first predetermined time T1 elapses since a time point when the n+1 th H section ((n+1)–H) starts.

According to an embodiment, the offset control signal output stage 700 may turn off the second switch by outputting the second offset control signal 720 having a low level to the offset blocking circuit 500 after the second predetermined time T2 elapses since the time point when the n+1 th H section ((n+1)–H) starts.

According to an embodiment, when the second switch 520 performs a turn-on operation, it is possible to turn off the current source of the second slew rate compensation circuit 420 since a voltage of the same level as the ground voltage VSS is generated in the second node ND2 of the second slew rate compensation circuit 420.

According to an embodiment of FIG. 7, during the rising or falling transition of the input voltage VIN, when the output voltage VOUT gets to a normal state, it is possible to eliminate the offset or noise, such as the parasitic current that occurs due to the slew rate compensation circuit.

Referring to FIG. 8, the offset control signal output stage 700 may set a timing in which the first and the second offset control signals 710 and 720 get to a high level or a low level since the first and the second 2-bit control signals 730 and 740 are set to "00". The offset control signal output stage 700 may set a third predetermined time T3 according to "00" which is the first 2-bit control signal 730, and may set a fourth predetermined time T4 according to "00" which is the second 2-bit control signal 740.

According to an embodiment, the n th H section (n–H) is a section at which the input voltage VIN is in a rising transition. Unlike the embodiment of FIG. 7, a case in which the output voltage VOUT exceeds the input voltage VIN in a rising transition (overshoot) is illustrated. The offset control signal output stage 700 may turn on the first switch 510 by outputting the first offset control signal 710 having a low level to the offset blocking circuit 500 after the third predetermined time T3 elapses since the time point when the n-th H section (n–H) starts.

According to an embodiment, the offset control signal output stage 700 may turn off the first switch 510 by outputting the first offset control signal 710 having a high level to the offset blocking circuit 500 after the fourth predetermined time T4 elapses since the time point when the n th H section(n–H) starts.

According to an embodiment, when the first switch 510 performs a turn-on operation, it is possible to turn off the current source of the first slew rate compensation circuit 410 since the voltage of the same level as the power supply voltage VDD is generated in the first node ND1 of the first slew rate compensation circuit 410.

According to an embodiment, the n+1 th H section ((n+1)–H) is a section at which the input voltage VIN is in a falling transition. Unlike the embodiment of FIG. 7, a case in which the output voltage VOUT becomes to be less than the input voltage VIN in a falling transition (undershoot) is illustrated. The offset control signal output stage 700 may turn on the second switch 520 by outputting the second offset control signal 720 having a high level to the offset blocking circuit 500 after the third predetermined time T3 elapses since the time point when the n+1 th H section ((n+1)–H) starts.

According to an embodiment, the offset control signal output stage 700 may turn off the second switch 520 by outputting the second offset control signal 720 having a low level to the offset blocking circuit 500 after the fourth predetermined time T4 elapses since the time point when the n+1 th H section((n+1)–H) starts.

According to an embodiment, when the second switch 520 performs a turn-on operation, it is possible to turn off the current source of the second slew rate compensation circuit 420 since a voltage of the same level as the ground voltage VSS is generated in the second node ND2 of the second slew rate compensation circuit 420.

As described by referring to FIG. 8, it is possible to suppress the occurrence of the overshoot or undershoot in the transient response state that may occur during the rising or falling transition of the output voltage VOUT.

Hereinafter, a method for controlling the buffer circuit 1000 according to an embodiment of the present disclosure will be described.

The method will be described by dividing a slew rate compensation operation configured to increase the output voltage VOUT when the input voltage VIN rises, and a slew rate compensation operation configured to decrease the output voltage VOUT when the input voltage VIN falls.

First, a case in which the input voltage VIN is in a rising transition will be described. According to an embodiment, the first comparator N_comp of the first slew rate compensation circuit 410 may compare the input voltage VIN to the output voltage VOUT. The threshold voltage of the NMOS transistor of the first comparator N_comp may be referred to as the first reference voltage. The first comparator N_comp may get to a turn-on operation state when a difference between the input voltage in a rising transition and the output voltage VOUT is equal to or more than the first reference voltage.

According to an embodiment, the first slew rate compensation circuit operation current generated in the first current source I_S1 by the turn-on operation state of the first comparator N_comp may be provided to the first slew rate transistor M_SP1 through the first node ND1. The first slew rate transistor M_SP1 may perform a turn-on operation based on the first slew rate compensation circuit operation current. The first slew rate compensation current I_SR1 may be provided to the load stage 200 from the second current source I_S2 by the turn-on operation of the first slew rate transistor M_SP1.

According to an embodiment, when the first differential mirror circuit 210 of the load stage 200 receives the first slew rate compensation current I_SR1, the first and the second PMOS transistors MP1 and MP2 forming the first differential mirror circuit 210 may be turned off. With this configuration, the current is not provided to the first output node PPG of the first differential mirror circuit 210 connected to the gate voltage of the first output transistor MPPWR of the output stage 300, and the voltage of the first output node PPG may decrease.

According to an embodiment, as the voltage of the first output node PPG, that is, the gate voltage of the first output transistor MPPWR decreases, the first output transistor MPPWR may get to a turn-on state. The push current I_Push flowing from the first output transistor MPPWR to the output terminal may increase, the output voltage VOUT output from the output terminal may rapidly increase and may become able to rapidly follow a rising transition of the input voltage VIN.

According to an embodiment, the offset control signal output stage 700 may generate the first offset control signal 710 having a low level after the first predetermined time T1 elapses since the time point when the H section, at which the input voltage VIN is in a rising transition, starts. The first switch 510 may perform a turn-on operation by the first offset control signal 710 having a low level. According to the turn-on operation of the first switch 510, it is possible to turn off the current source of the first slew rate compensation circuit 410 since the voltage of the same level as the power supply voltage VDD is generated at the first node ND1 of the first slew rate compensation circuit 410.

According to an embodiment, the offset control signal output stage 700 may generate the first offset control signal 710 having a low level after the third predetermined time T3 elapses since the time point when the H section, at which the input voltage VIN is in a rising transition, starts. The first switch 510 may perform a turn-on operation if the first offset control signal 710 has a low level. According to the turn-on operation of the first switch 510, it is possible to turn off the current source of the first slew rate compensation circuit 410 since the voltage of the same level as the power supply voltage VDD is generated at the first node ND1 of the first slew rate compensation circuit 410. Therefore, it is possible to prevent the case in which the output voltage VOUT exceeds the input voltage VIN in a rising transition, that is, the overshoot.

Next, when the input voltage VIN is in a falling transition, according to an embodiment, the second comparator P_comp of the second slew rate compensation circuit 420 may compare the input voltage VIN to the output voltage VOUT. The threshold voltage of the PMOS transistor of the second comparator P_comp may be referred to as the second reference voltage. The second comparator P_comp may get to a turn-on operation state when a difference between the input voltage VIN in a falling transition and the output voltage VOUT is equal to or more than the second reference voltage.

According to an embodiment, at the second node ND2, the second slew rate transistor M_SN1 may receive the second slew rate compensation circuit operation current generated in the third current source I_S3 by the turn-on operation of the second comparator P_comp. The second slew rate transistor M_SN1 may perform a turn-on operation based on the second slew rate compensation circuit operation current. The fourth current source I_S4 may receive the second slew rate compensation current I_SR2 from the load stage 200 by the turn-on operation of the second slew rate transistor M_SN1.

According to an embodiment, when the second differential mirror circuit 220 of the load stage 200 provides the second slew rate compensation current I_SR2, the first and the second load stage NMOS transistors MN1 and MN2 forming the second differential mirror circuit 220 may be turned off. With this configuration, the current is not provided to the ground voltage VSS from the second output node PNG of the second differential mirror circuit 220 connected to the gate terminal of the second output transistor MNPWR of the output stage 300, and the voltage of the second output node PNG may increase.

According to an embodiment, as the voltage of the second output node PNG, that is, the gate voltage of the second output transistor MNPWR increases, the second output transistor MNPWR may get to a turn-on state. The pull current I_Pull flowing from the output terminal to the second output transistor MNPWR may increase, the output voltage output from the output terminal may rapidly decrease, and become able to rapidly follow a falling transition of the input voltage VIN.

According to an embodiment, the offset control signal output stage 700 may generate the second offset control signal 720 having a high level after the first predetermined time T1 elapses since the time point when the H section, at which the input voltage VIN is in a falling transition, starts. The second switch 520 may perform a turn-on operation if the second offset control signal 720 has a high level. According to the turn-on operation of the second switch 520, it is possible to turn off the current source of the second slew rate compensation circuit 420 since the voltage of the same level as the ground voltage VSS is generated in the second node ND2 of the second slew rate compensation circuit 420.

According to an embodiment, the offset control signal output stage 700 may generate the second offset control signal 720 having a high level after the third predetermined time T3 elapses since the time point when the H section, at which the input voltage VIN is in a falling transition, starts. The second switch 520 may perform a turn-on operation if the second offset control signal 720 has a high level. According to the turn-on operation of the second switch 520, it is possible to turn off the current source of the second slew rate compensation circuit 420 since the voltage equal to the ground voltage VSS is generated in the second node ND2 of the second slew rate compensation circuit 420. Therefore, it is possible to prevent the case in which the output voltage VOUT becomes less than the input voltage VIN in a falling transition, that is, the occurrence of the undershoot.

With this configuration, the buffer circuit 1000 may maintain the slew rate compensation circuit to operate normally when the slew rate compensation currents I_SR1 and I_SR2 are provided or received, suppress the occurrence of the overshoot or undershoot in the transient response state by including the offset blocking circuit 500 capable of blocking the current source of the slew rate compensation circuit 400 at a section or during a time which does not require the slew rate compensation, and eliminate the occurrence of the noise such as the parasitic current caused by the slew rate compensation circuit in a normal state.

Various embodiments of the present disclosure relate to a buffer circuit with an improved slew rate. The buffer circuit may improve a slew rate of an output voltage in a rising or a falling transition by following a rising or a falling transition of an input voltage using a slew rate compensation circuit and prevent noise and the like from the buffer circuit by blocking a current source of the slew rate compensation circuit at a time when the improvement of the slew rate is not needed.

Therefore, various embodiments of the present disclosure aim to provide a buffer circuit, including an offset blocking circuit capable of allowing a slew rate compensation circuit to operate normally when a slew rate compensation current is supplied and block a current source of the slew rate compensation circuit during sections or times when the slew rate compensation is not desired.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above and all drawing disclosures, the scope of the disclosure is also inclusive of the claims and their equivalents, i.e., all variations within the scope of the claims and their equivalents are to be construed as being included in the disclosure.

What is claimed is:

1. A buffer circuit for generating an output voltage based on an input voltage, comprising:

an input stage, a load stage, and an output stage, wherein the input stage is configured to provide first and second differential currents to the load stage or receive third and fourth differential currents from the load stage based on a difference between the input voltage and the output voltage, wherein the load stage is configured to apply gate voltages to first and second output transistors of the output stage based on the first to fourth differential currents, and wherein the output stage is configured to regulate the output voltage based on the gate voltages applied to the first and the second output transistors;

a slew rate compensation circuit configured to provide a first slew rate compensation current to the load stage or receive a second slew rate compensation current from the load stage based on the difference between the input voltage and the output voltage;

an offset control signal output stage configured to output an offset control signal by being applied with first and second N-bit control signals which are logic signals; and an offset blocking circuit comprising a switch configured to turn off a current source of the slew rate compensation circuit by the offset control signal.

2. The buffer circuit of claim 1, wherein the slew rate compensation circuit comprises:

a first slew rate compensation circuit comprising a current source configured to provide the first slew rate compensation current to the load stage when a difference between the input voltage and the output voltage during a rising transition of the input voltage is equal to or more than a first reference voltage; and a second slew rate compensation circuit comprising a current source configured to receive the second slew rate compensation current from the load stage when a difference between the input voltage and the output voltage during a falling transition of the input voltage is equal to or more than a second reference voltage.

3. The buffer circuit of claim 2, wherein the first slew rate compensation circuit comprises:

a first comparator comprising an NMOS transistor having a gate configured to receive the input voltage, a drain connected to a first node, and a source configured to receive the output voltage;

a first current source configured to generate a first slew rate compensation circuit operation current based on a difference between a power supply voltage and a voltage of the first node when the NMOS transistor of the first comparator performs a turn-on operation;

a first slew rate transistor configured to receive the first slew rate compensation circuit operation current through a gate terminal connected to the first node and perform a turn-on operation based on the first slew rate compensation circuit operation current; and a second current source configured to generate the first slew rate compensation current based on the power supply voltage and provide the first slew rate compensation current to the load stage by the turn-on operation of the first slew rate transistor.

4. The buffer circuit of claim 3, wherein the second slew rate compensation circuit comprises:

a second comparator comprising a PMOS transistor having a gate configured to receive the input voltage, a drain connected to a second node, and a source configured to receive the output voltage;

a third current source configured to generate a second slew rate compensation circuit operation current based on a difference between a ground voltage and a voltage of the second node when the PMOS transistor of the second comparator performs a turn-on operation;

a second slew rate transistor configured to receive the second slew rate compensation circuit operation current through a gate terminal connected to the second node and perform a turn-on operation based on the second slew rate compensation circuit operation current; and a fourth current source configured to generate the second slew rate compensation current based on the ground voltage and receive the second slew rate compensation current from the load stage by the turn-on operation of the second slew rate transistor.

5. The buffer circuit of claim 2, wherein the switch of the offset blocking circuit comprises:

a first switch having a gate configured to receive a first offset control signal, a source connected to a power supply voltage, and a drain connected to the first node of the first slew rate compensation circuit; and a second switch having a gate configured to receive a second offset control signal, a drain connected to the second node of the second slew rate compensation circuit, and a source connected to a ground voltage.

6. The buffer circuit of claim 5, wherein the offset control signal output stage turns on the first switch by generating the first offset control signal of a low level after a first predetermined time elapses by the first N-bit control signal, and turns off the first switch by generating the first offset control signal of a high level after a second predetermined time elapses by the second N-bit control signal.

7. The buffer circuit of claim 5, wherein the offset control signal output stage turns on the second switch by generating the second offset control signal of a high level after a first predetermined time elapses by the first N-bit control signal, and turns off the second switch by generating the second offset control signal of a low level after a second predetermined time elapses by the second N-bit control signal.

8. The buffer circuit of claim 5, wherein the offset blocking circuit turns off a current source of the first slew rate compensation circuit by generating a level of a voltage equal to a level of a power supply voltage to the first node of the first slew rate compensation circuit, and turns off a current source of the second slew rate compensation circuit by generating a level of a voltage equal to a level of a ground voltage to the second node of the second slew rate compensation circuit.

9. The buffer circuit of claim 1, wherein the load stage comprises:

a first differential mirror circuit having a current mirror structure and a cascode structure, and configured to mirror the third and fourth differential currents and the first slew rate compensation current;

a second differential mirror circuit having a current mirror structure and a cascode structure, and configured to mirror the first and second differential currents and the second slew rate compensation current; and a third bias circuit and a fourth bias circuit connected between the first differential mirror circuit and the second differential mirror circuit, and configured to control a static state operation and an amplification operation of the first differential mirror circuit and the second differential mirror circuit.

10. The buffer circuit of claim 9, wherein the first differential mirror circuit comprises first and second load stage PMOS transistors configured to perform a current mirroring operation, and third and fourth load stage PMOS transistors connected in series with the first and second load stage PMOS transistors, respectively, to form a cascode structure, wherein the first load stage PMOS transistor has a gate in common with the second load stage PMOS transistor connected to the third bias circuit, a drain connected to a third node of the load stage connected between the first and third load stage PMOS transistors, and a source connected to a power supply voltage, wherein the second load stage PMOS transistor has a gate in common with the first load stage PMOS transistor connected to the third bias circuit, a drain connected to a seventh node of the load stage connected between the second and fourth load stage PMOS transistors, and a source connected to the power supply voltage, wherein the third load stage PMOS transistor has a gate connected between the third bias circuit and the first load stage PMOS transistor and configured to receive a second bias voltage, a drain connected to the third bias circuit and a fifth node of the load stage connected to the third bias circuit, and a source connected the third node, and wherein the fourth load stage PMOS transistor has a gate connected between the fourth bias circuit and the second load stage PMOS transistor and configured to receive the second bias voltage, a drain connected to the fourth bias circuit, and a source connected to the seventh node.

11. The buffer circuit of claim 10, wherein the first differential mirror circuit is configured to receive the first slew rate compensation current through the third node from the slew rate compensation circuit.

12. The buffer circuit of claim 9, wherein the second differential mirror circuit comprises first and second load stage NMOS transistors configured to perform a current mirroring operation, and third and fourth load stage NMOS transistors connected in series with the first and second load stage NMOS transistors, respectively, to form a cascode structure, wherein the first load stage NMOS transistor has a gate in common with the second load stage NMOS transistor connected to the third bias circuit, a drain connected to a fourth node of the load stage connected between the first and third load stage NMOS transistors, and a source connected to a ground voltage, wherein the second load stage NMOS transistor has a gate in common with the first load stage NMOS transistor connected to the third bias circuit, a drain connected to an eighth node of the load stage connected between the second and fourth load stage NMOS transistors, and a source connected to the ground voltage, wherein the third load stage NMOS transistor has a gate connected between the third bias circuit and the first load stage NMOS transistor and configured to receive a fifth bias voltage applied to gate terminals of the third and fourth load stage NMOS transistors, a drain connected to the third bias circuit, and a source connected to the fourth node, and wherein the fourth load stage NMOS transistor has a gate connected between the fourth bias circuit and the second load stage NMOS transistor and configured to receive the fifth bias voltage, a drain connected to the fourth bias circuit, and a source connected to the eighth node.

13. The buffer circuit of claim 12, wherein the second differential mirror circuit is configured to provide the second slew rate compensation current from the fourth node to the slew rate compensation circuit.

14. A buffer circuit for generating an output voltage based on an input voltage, comprising:

an input stage, a load stage, and an output stage, wherein the input stage is configured to provide first and second differential currents to the load stage based on a difference between the input voltage and the output voltage or receive third and fourth differential currents from the load stage, wherein the load stage is configured to apply gate voltages to first and second output transistors of the output stage based on the first to fourth differential currents, and wherein the output stage is configured to regulate the output voltage based on the gate voltages applied to the first and the second output transistors;

a slew rate compensation circuit configured to provide first slew rate compensation current to the load stage when a difference between a voltage level of the input voltage and a voltage level of the output voltage is equal to or more than a first reference voltage during a rising transition, and receive a second slew rate compensation current from the load stage when a difference between a voltage level of the input voltage and a voltage level of the output voltage is equal to or more than a second reference voltage during a falling transition;

an offset control signal output stage configured to receive first and second N-bit control signals which are logic signals to output an offset control signal; and an offset blocking circuit comprising first and second switches configured to turn off a current source of the slew rate compensation circuit by the offset control signal.

15. The buffer circuit of claim 14, wherein the offset control signal output stage;

turns on the first switch by generating a first offset control signal of a low level after a first predetermined time elapses since the rising transition by the first N-bit control signal, and turns off the first switch by generating the first offset control signal of a high level after a second predetermined time elapses since the rising transition by the second N-bit control signal.

16. The buffer circuit of claim 14, wherein the offset control signal output stage:

turns on the second switch by generating a second offset control signal of a high level after a first predetermined time elapses since the falling transition by the first N-bit control signal, and turns off the second switch by generating the second offset control signal of a low level after a second predetermined time elapses since the falling transition by the second N-bit control signal.

17. A method for controlling a buffer circuit, comprising:

comparing an input voltage to an output voltage of the buffer circuit;

providing or receiving a slew rate compensation current to or from a load stage when a difference between the input voltage and the output voltage is equal to or more than a reference voltage;

turning off transistors of the load stage based on the slew rate compensation current;

increasing or decreasing a gate voltage of an output transistor of an output stage connected to the load stage;

increasing a slew rate in a rising transition or a falling transition of the output voltage based on increase or decrease of the gate voltage of the output transistor;

receiving first and second N-bit control signals which are logic signals at an offset control signal output stage and outputting first and second offset control signals; and controlling first and second switches of an offset blocking circuit configured to turn off a current source of a slew rate compensation circuit according to the first and second offset control signals.

18. The method of claim 17, further comprising:

providing a first slew rate compensation current from the slew rate compensation circuit to the load stage when a difference between the input voltage and the output voltage is equal to or more than a first reference voltage during the rising transition; and receiving, at the slew rate compensation circuit, a second slew rate compensation current from the load stage when a difference between the input voltage and the output voltage is equal to or more than a second reference voltage during the falling transition.

19. The method of claim 18, further comprising:

turning on a first switch by generating a first offset control signal of a low level after a first predetermined time elapses since the rising transition by the first N-bit control signal;

blocking providing the first slew rate compensation current from the slew rate compensation circuit to the load stage; and turning off the first switch by generating the first offset control signal of a high level after a second predetermined time elapses since the rising transition by the second N-bit control signal.

20. The method of claim 18, further comprising:

turning on a second switch by generating a second offset control signal of a high level after a first predetermined time elapses since the falling transition by the first N-bit control signal;

blocking providing the second slew rate compensation current from the load stage to the slew rate compensation circuit; and turning off the second switch by generating the second offset control signal of a low level after a second predetermined time elapses since the falling transition by the second N-bit control signal.

* * * * *